(12) United States Patent
Okada

(10) Patent No.: US 8,536,534 B2
(45) Date of Patent: Sep. 17, 2013

(54) RADIOGRAPHIC IMAGING DEVICE

(75) Inventor: Yoshihiro Okada, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 228 days.

(21) Appl. No.: 13/194,377

(22) Filed: Jul. 29, 2011

(65) Prior Publication Data

US 2012/0049077 A1 Mar. 1, 2012

(30) Foreign Application Priority Data

Aug. 31, 2010 (JP) ................................. 2010-195205

(51) Int. Cl.
*G01T 1/24* (2006.01)

(52) U.S. Cl.
USPC .................. 250/370.08; 250/366; 250/370.11

(58) Field of Classification Search
USPC ...................................... 250/361, 366, 370.08
See application file for complete search history.

(56) References Cited

U.S. PATENT DOCUMENTS

| | | | | |
|---|---|---|---|---|
| 4,879,464 A * | 11/1989 | Iinuma | | 250/361 R |
| 5,444,756 A | 8/1995 | Pai et al. | | |
| 6,307,915 B1 | 10/2001 | Fröjdh | | |
| 6,867,418 B2 * | 3/2005 | Suzuki et al. | | 250/368 |
| 6,891,164 B2 * | 5/2005 | Suzuki | | 250/370.11 |
| 6,919,569 B2 * | 7/2005 | Homme et al. | | 250/370.11 |
| 6,999,121 B2 | 2/2006 | Endo | | |
| 7,616,231 B2 * | 11/2009 | Farrier | | 348/208.99 |
| 8,093,562 B2 * | 1/2012 | Yokoyama et al. | | 250/370.08 |
| 2002/0050940 A1 * | 5/2002 | Sato et al. | | 341/155 |
| 2002/0101527 A1 * | 8/2002 | Endo | | 348/302 |
| 2006/0076499 A1 * | 4/2006 | Endo | | 250/370.11 |
| 2006/0113484 A1 * | 6/2006 | Endo | | 250/370.11 |
| 2006/0181627 A1 * | 8/2006 | Farrier | | 348/308 |
| 2006/0237656 A1 | 10/2006 | Ishii et al. | | |
| 2007/0109433 A1 | 5/2007 | Yamada et al. | | |
| 2009/0190932 A1 * | 7/2009 | Nishino et al. | | 398/140 |
| 2009/0214219 A1 * | 8/2009 | Misawa et al. | | 398/128 |
| 2009/0214220 A1 * | 8/2009 | Nishino et al. | | 398/130 |
| 2010/0038549 A1 * | 2/2010 | Nishino et al. | | 250/370.09 |
| 2010/0051819 A1 | 3/2010 | Jung et al. | | |
| 2010/0054399 A1 * | 3/2010 | Nishino et al. | | 378/28 |
| 2010/0207032 A1 * | 8/2010 | Tsubota et al. | | 250/370.09 |

* cited by examiner

FOREIGN PATENT DOCUMENTS

EP 1746442 A1 1/2007
JP 2002-181942 A 6/2002

OTHER PUBLICATIONS

Extended European Search Report issued in corresponding European Application No. 11175836.3, dated Dec. 27, 2011.

*Primary Examiner* — David Porta
*Assistant Examiner* — Taeho Jo
(74) *Attorney, Agent, or Firm* — Sughrue Mion, PLLC

(57) ABSTRACT

The present invention provides a radiographic imaging including, provided at an insulating substrate, sensor portions for radiation detection that generate charges due to receive radiation or light converted from radiation, first signal lines that are connected to the sensor portions for radiation detection and through which flow electric signals that correspond to the charges generated at the sensor portions for radiation detection, and second signal lines having a substantially same wiring pattern as the first signal lines. Detection of radiation is carried out on the basis of a difference between an electric signal flowing through the first signal line and an electric signal flowing through the second signal line, or a difference between values of digital data obtained by digitally converting an electric signal flowing through the first signal line and an electric signal flowing through the second signal line, respectively.

14 Claims, 29 Drawing Sheets

RADIOGRAPHIC IMAGING DEVICE

CROSS-REFERENCE TO RELATED APPLICATION

This application claims priority under 35 USC 119 from Japanese Patent Application No. 2010-195205 filed on Aug. 31, 2010, the disclosure of which is incorporated by reference herein.

BACKGROUND OF THE INVENTION

1. Field of the Invention

The present invention relates to a radiographic imaging device. In particular, the present invention relates to a radiographic imaging device that includes sensors for radiation detection and that carries out detection of at least one of the start of irradiation of radiation, the end of irradiation of radiation, and the irradiated amount of radiation.

2. Description of the Related Art

Radiographic imaging devices using a radiation detecting element such as an FPD (flat panel detector), in which a radiation sensitive layer is disposed on a TFT (thin film transistor) active matrix substrate and that can convert radiation such as X-rays or the like directly into digital data, or the like, have been put into practice in recent years. As compared with a conventional imaging plate, an FPD has the advantages that an image can be confirmed immediately and video images as well can be confirmed, and the popularization of FPDs is advancing rapidly.

Various types of radiation detecting element have been proposed. For example, there is a direct-conversion-type radiation detecting element that converts radiation directly into charges at a semiconductor layer, and accumulates the charges. Moreover, there is an indirect-conversion-type radiation detecting element that once converts radiation into light at a scintillator of CsI:Tl, GOS ($Gd_2O_2S$:Tb), or the like, and, at a semiconductor layer, converts the converted light into charges, and accumulates the charges.

At the radiation detecting element, even in a state in which radiation is not being irradiated, charges are generated due to dark current or the like, and the charges are accumulated in the respective pixels. Therefore, during standby, the radiographic imaging device that uses the radiation detecting element repeatedly carries out a resetting operation of extracting and eliminating the charges accumulated in the respective pixels of the radiation detecting element. At the time of imaging, the radiographic imaging device stops the resetting operation, and, during the radiation irradiating time period, accumulates charges. After the irradiating time period ends, the radiographic imaging device carries out reading-out of the charges accumulated in the respective pixels of the radiation detecting element.

As a technique that synchronizes the timing of irradiating radiation and the timing of starting the accumulation of charges by the radiation detecting element, Japanese Patent Application Laid-Open (JP-A) No. 2002-181942 discloses a technique of placing a sensor for radiation detection individually outside of the imaging region of the radiation detecting element, and causing accumulation of the charges to be started by the radiation detecting element at the time when radiation is detected at this sensor for radiation detection.

There are cases in which noise arises at the radiation detecting element due to any of various external disturbances such as shock, temperature or the like at the respective lines that are laid. There are cases in which noise arises also in the line that is connected to the sensor for radiation detection such as that of JP-A No. 2002-181942.

Therefore, when, for example, the electric signal flowing through the line connected to the sensor for radiation detection is converted into digital data, and the value of the converted digital data is compared with a predetermined threshold value for radiation sensing, and, in accordance with whether or not the value of the digital data is greater than or equal to the threshold value, it is detected whether or not radiation is irradiated, the threshold value for radiation sensing must be made to be large in order to prevent erroneous sensing of the start of irradiation of the radiation due to noise that is superimposed on the lines. However, if the threshold value for radiation sensing is made to be large, the timing of detecting the start of irradiation of radiation may become late.

SUMMARY OF THE INVENTION

The present invention provides a radiographic imaging device that suppresses the effects of noise and may accurately detect radiation, even when noise arises due to an external disturbance or the like.

A first aspect of the present invention is a radiographic imaging device including: an insulating substrate at which are provided, sensor portions for radiation detection that generate charges due to received radiation or light converted from radiation, first lines that are connected to the sensor portions for radiation detection and through which flow electric signals that correspond to the charges generated at the sensor portions for radiation detection, and second lines having a substantially same wiring pattern as the first lines; and a detecting section that detects radiation on the basis of a difference between an electric signal flowing through the first line and an electric signal flowing through the second line, or a difference between values of digital data obtained by digitally converting an electric signal flowing through the first line and an electric signal flowing through the second line, respectively.

The radiographic imaging device of the present invention has the insulating substrate at which are provided the sensor portions for radiation detection that receive radiation or light converted from radiation and that generate charges, the first lines that are connected to the sensor portions for radiation detection and through which flow electric signals that correspond to the charges generated at the sensor portions for radiation detection, and the second lines having a substantially same wiring pattern as the first lines.

Further, radiation is detected by the detecting section on the basis of a difference between an electric signal flowing through the first line and an electric signal flowing through the second line, or a difference between values of digital data obtained by digitally converting an electric signal flowing through the first line and an electric signal flowing through the second line, respectively. Note that at least one of a start of irradiation of radiation, an end of irradiation of radiation, and an irradiated amount of radiation may be detected by detecting radiation in this way.

In this way, in accordance with the present invention, due to the above-described first aspect, effects of noise are suppressed and radiation can be accurately detected, even when noise arises due to external disturbance or the like.

In a second aspect of the present invention, in the above-described first aspect, at the insulating substrate, may further be provided with, a plurality of scan lines that are provided in parallel, a plurality of signal lines that are provided in parallel and that intersect the scan lines, and a plurality of pixels that are provided at intersection portions of the scan lines and the signal lines and that have sensor portions that generate charges due to irradiated radiation, or illuminated light converted from irradiated radiation, and wherein the sensor portions of some of the pixels may function as the sensor portions for radiation detection.

In a third aspect of the present invention, in the above-described second aspect, at pixels having the sensor portions for radiation detection, the sensor portions for radiation detection may be electrically connected to the signal lines, and electric signals, that correspond to the charges generated at the sensor portions for radiation detection, flow to the signal lines, and wherein at other pixels may include, switching elements that turn ON and OFF in accordance with states of control signals that flow through the scan lines, and, at the other pixels, the sensor portions are electrically connected to the signal lines via the switching elements, and electric signals, that correspond to charges generated at the sensor portions, flow to the signal lines in accordance with the states of the control signals, and any of the signal lines, to which the pixels having the sensor portions for radiation detection are connected, may function as the first line, and any of the signal lines, to which the pixels having the sensor portions for radiation detection are not connected or at which a connected number of the pixels having the sensor portions for radiation detection is smaller than at the first line, may function as the second line.

In a fourth aspect of the present invention, in the above-described third aspect, may further include a plurality of signal detecting circuits to each of which a predetermined number of the plurality of signal lines are connected, and that detect electric signals that flow to the respective signal lines, wherein any of the signal lines, that is connected to the same signal detecting circuit as the signal line may function as the first line and to which the pixels having the sensor portions for radiation detection are not connected or at which a connected number of the pixels having the sensor portions for radiation detection is smaller than at the first line, may function as the second line.

In a fifth aspect of the present invention, in the above-described third and fourth aspects, a signal line, that is adjacent to the signal line that functions as the first line, and to which the pixels having the sensor portions for radiation detection are not connected or at which a connected number of the pixels having the sensor portions for radiation detection is smaller than at the first line, may function as the second line.

In a sixth aspect of the present invention, in the above-described third through fifth aspects, two or more signal lines, to which the pixels having the sensor portions for radiation detection are not connected or at which a connected number of the pixels having the sensor portions for radiation detection is smaller than at the first line, may function as the second lines, and wherein the detecting section may respectively digitally convert electric signals flowing through the signal line that functions as the first line and the two or more signal lines that function as the second lines, and may detect radiation on the basis of a difference between a value of digital data of the signal line that functions as the first line and an average value of digital data of the two or more signal lines that function as the second lines.

In a seventh aspect of the present invention, in the above-described third through sixth aspects, the pixels having the sensor portions for radiation detection may further include short-circuited switching elements, and the sensor portions for radiation detection are electrically connected to the signal lines via the short-circuited switching elements.

In an eighth aspect of the present invention, in the above-described third through sixth aspects, second scan lines may be provided at the insulating substrate separately from the scan lines, and the pixels having the sensor portions for radiation detection may include second switching elements that turn ON and OFF in accordance with states of control signals flowing through the second scan lines, and the sensor portions for radiation detection may be electrically connected to the signal lines via the second switching elements.

In a ninth aspect of the present invention, in the above-described second through eighth aspects, a plurality of the pixels including the sensor portions for radiation detection may be respectively provided, at intervals of one or more pixels, in correspondence with some of the signal lines of the plurality of signal lines.

In a tenth aspect of the present invention, in the above-described first aspect, wherein, at the insulating substrate, may further be provided with, a plurality of scan lines that are provided in parallel, a plurality of signal lines that are provided in parallel and intersect the scan lines, and a plurality of pixels that are provided at intersection portions of the scan lines and the signal lines, and that have sensor portions that generate charges due to irradiation of radiation, or illumination of light converted from irradiated radiation, and wherein the sensor portions for radiation detection, the first lines, and the second lines may be disposed at a periphery of a region at which the plurality of pixels are provided.

In an eleventh aspect of the present invention, in the above-described second through tenth aspects, the detecting section may detect a start of irradiation of radiation, and the radiographic imaging device may further include: a control signal outputting section that outputs the control signals to the plurality of scan lines; and a control section that, during standby, controls the control signal outputting section such that a resetting operation, in which control signals that carry out extracting of charges are outputted to the plurality of scan lines and charges are taken-out from the plurality of pixels, is carried out repeatedly, and, during radiographic imaging, when the start of irradiation of radiation is detected by the detecting section, the control section controls the control signal outputting section such that control signals that prohibit extracting of charges are outputted to the plurality of scan lines, and after irradiation of radiation ends, control signals that carry out extracting of charges are outputted to the plurality of scan lines.

In a twelfth aspect of the present invention, in the above-described eleventh aspect, during the radiographic imaging, the control section may control the control signal outputting section such that the resetting operation is carried out repeatedly until the start of irradiation of radiation is detected by the detecting section.

In a thirteenth aspect of the present invention, in the above-described eleventh aspect, during the radiographic imaging, the control section may control the control signal outputting section such that control signals that prohibit extracting of charges are outputted to the plurality of scan lines until the start of irradiation of radiation is detected by the detecting section.

In a fourteenth aspect of the present invention, in the above-described eleventh through thirteenth aspects, at a time of the resetting operation, the control signal outputting section may output control signals that carry out extracting of charges, to the plurality of scan lines in order, or at a single time to all of the plurality of scan lines.

Accordingly, the radiographic imaging device of the above-described aspects of the present invention may suppress effects of noise and may accurately detect radiation, even when noise arises due to external disturbance or the like.

BRIEF DESCRIPTION OF THE DRAWINGS

Exemplary embodiments of the present invention will be described in detail based on the following figures, wherein.

DETAILED DESCRIPTION OF THE INVENTION

Hereinafter, the present invention will be described with reference to the drawings.

The present exemplary embodiments describe cases in which the present invention is applied to an indirect-conversion-type radiation detecting element 10 that once converts radiation such as X-rays or the like into light, and converts the converted light into charges.

[First Exemplary Embodiment]

Figure 1:
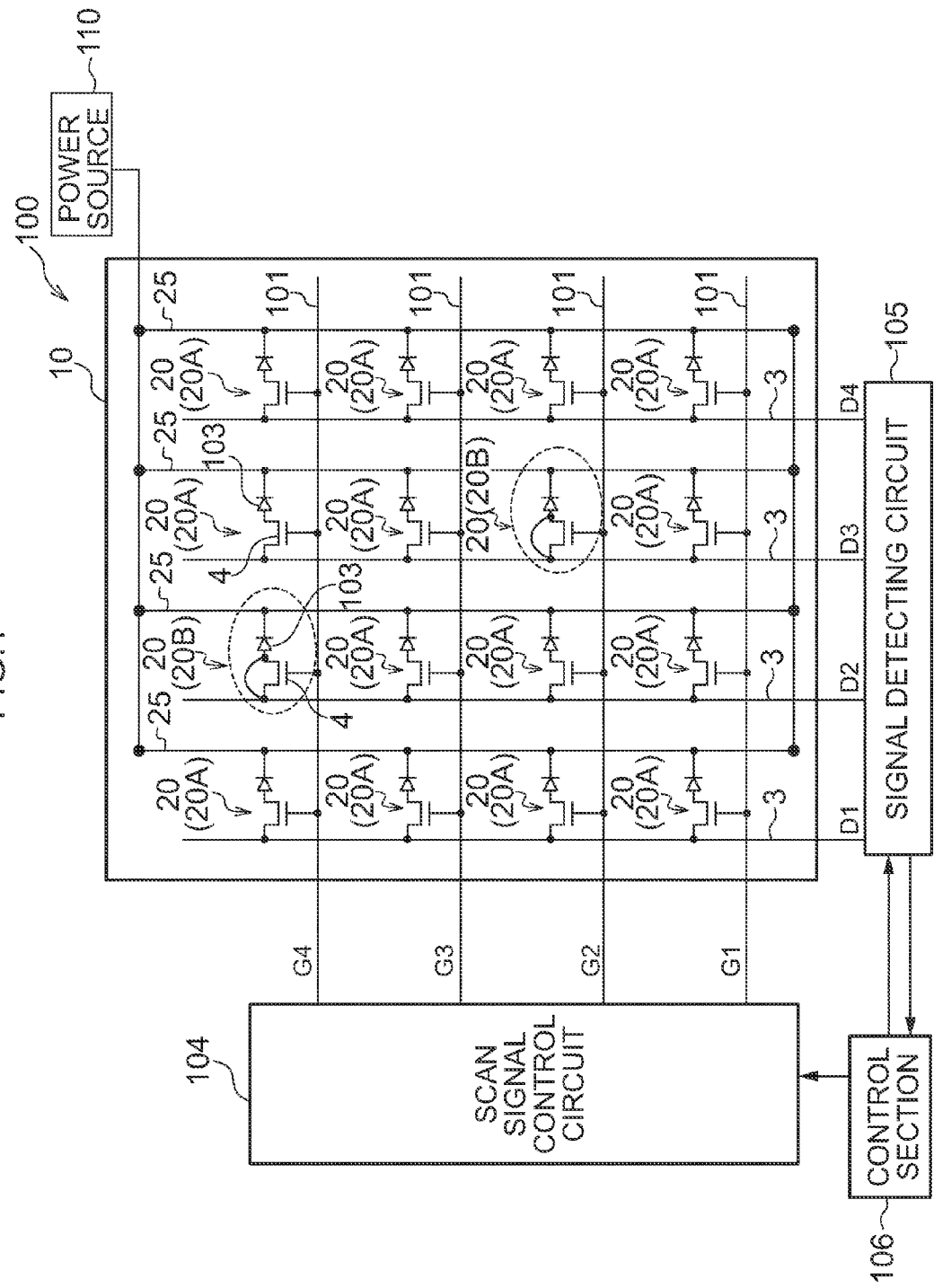
FIG. 1 is a drawing showing the overall configuration of a radiographic imaging device relating to a first exemplary embodiment.

The schematic configuration of a radiographic imaging device 100 that uses the radiation detecting element 10 relating to the first exemplary embodiment is shown in FIG. 1.

As shown in FIG. 1, the radiographic imaging device 100 relating to the present exemplary embodiment has the indirect-conversion-type radiation detecting element 10. Note that the scintillator that converts radiation into light is omitted.

Plural pixels 20 are disposed at the radiation detecting element 10. The pixel 20 has a sensor portion 103 that receives light, generates charges, and accumulates the generated charges, and a TFT switch 4 for reading-out the charges accumulated in the sensor portion 103. In the present exemplary embodiment, charges are generated at the sensor portions 103 due to light, that has been converted by the scintillator, being illuminated onto the sensor portions 103.

The plural pixels 20 are disposed in the form of a matrix in one direction (the lateral direction in FIG. 1, hereinafter also called the "row direction") and in a direction (the vertical direction in FIG. 1, hereinafter also called the "column direction") that intersects the row direction. In FIG. 1 and in FIG. 6, the arrangement of the pixels 20 is shown in a simplified manner, but, for example, 1024×1024 of the pixels 20 are disposed in the one direction and in the intersecting direction.

In the present exemplary embodiment, among the plural pixels 20, pixels 20A for radiographic imaging and pixels 20B for radiation detection are determined in advance. In FIG. 1, and in FIG. 6, FIG. 11, FIG. 16, FIG. 23 and FIG. 26, the pixels 20B for radiation detection (radiation detection pixels 20B) are surrounded by the dashed lines. The pixels 20A for radiographic imaging (radiographic imaging pixels 20A) are used in order to detect radiation and generate an image expressed by the radiation, and the radiation detection pixels 20B are used in order to detect the start of irradiation of the radiation.

Further, at the radiation detecting element 10, plural scan lines 101 that are for turning the TFT switches 40N and OFF, and plural signal lines 3 that are for reading-out the charges accumulated in the sensor portions 103, are provided on a substrate 1 (see FIG. 3) so as to intersect one another. In the present exemplary embodiment, one of the signal lines 3 is provided for each line of pixels in the column direction, and one of the scan lines 101 is provided for each line of pixels in the row direction. For example, when there are 1024×1024 of the pixels 20 disposed in the row direction and the column direction, there are 1024 of each of the signal lines 3 and the scan lines 101.

At the radiation detecting element 10, common electrode lines 25 are provided in parallel to the respective signal lines 3. The one ends and the other ends of the common electrode lines 25 are connected in parallel, and the one ends are connected to a power source 110 that supplies a predetermined bias voltage. The sensor portions 103 are connected to the common electrode lines 25, and bias voltage is applied thereto via the common electrode lines 25.

Control signals for switching the respective TFT switches 4 flow to the scan lines 101. Due to control signals flowing to the respective scan lines 101 in this way, the respective TFT switches 4 are switched.

Electric signals, that correspond to the charges accumulated in the respective pixels 20, flow to the signal lines 3 in accordance with the switched states of the TFT switches 4 of the respective pixels 20. More concretely, an electric signal corresponding to the accumulated charge amount flows to the signal line 3 due to any of the TFT switches 4 of the pixels 20 connected to that signal line 3 being turned ON.

Figure 6:
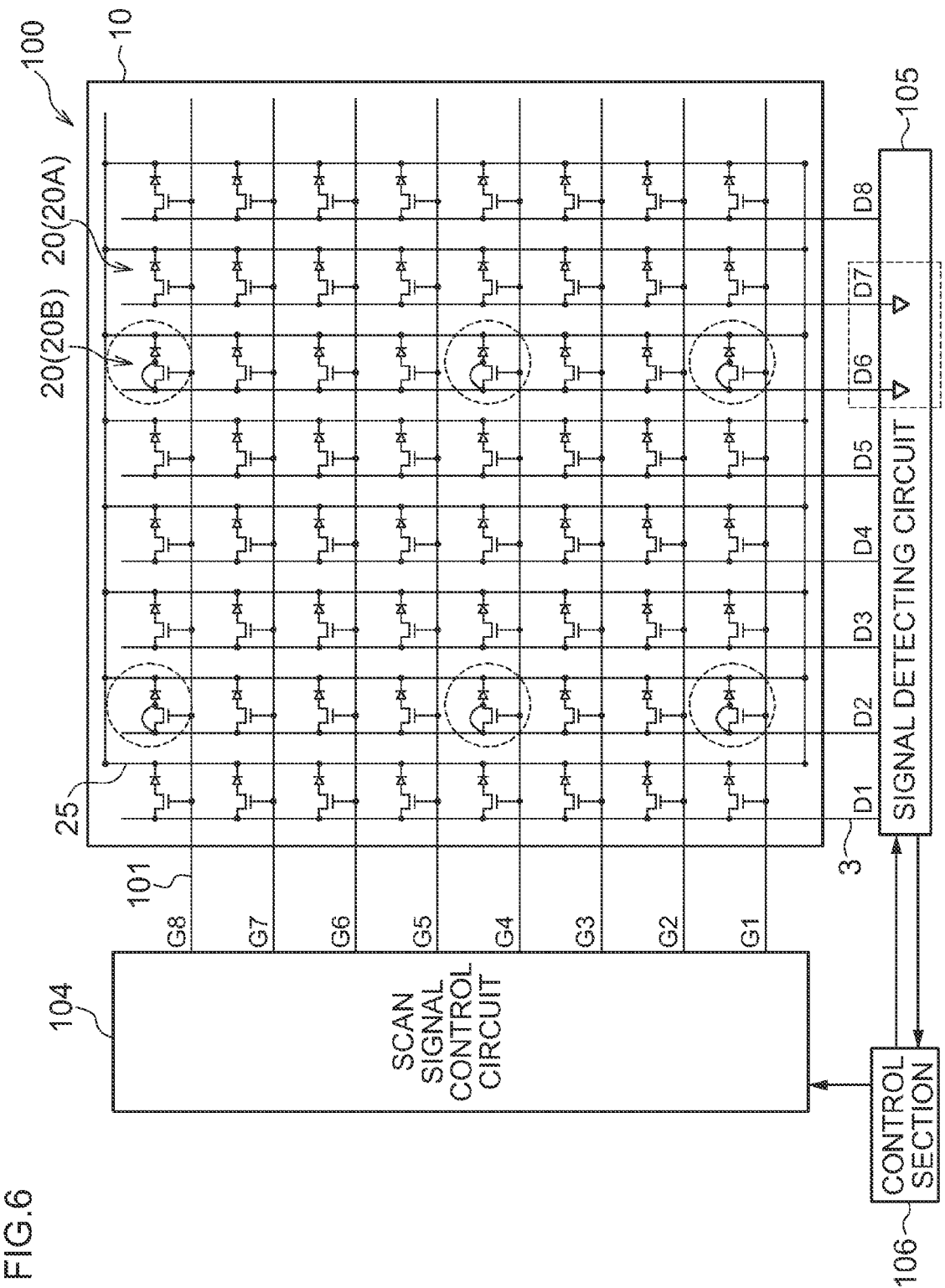
FIG. 6 is a drawing showing the arranged configuration of pixels for radiographic imaging and pixels for radiation detection of the radiation detecting element relating to the first exemplary embodiment.

Signal detecting circuits 105, that detect the electric signals that flow-out to the respective signal lines 3, are connected to the respective signal lines 3. Further, scan signal control circuits 104, that output, to the respective scan lines 101, control signals for turning the TFT switches 4 on and off, are connected to the respective scan lines 101. In FIG. 1 and FIG. 6, illustration is simplified by showing one of each of the signal detecting circuit 105 and the scan signal control circuit 104. However, for example, plural signal detecting circuits 105 and plural scan signal control circuits 104 are provided, and a predetermined number (e.g. 256) of the signal lines 3 or the scan lines 101 are connected to each. For example, when 1024 of each of the signal lines 3 and the scan lines 101 are provided, four of the scan signal control circuits 104 are provided and 256 of the scan lines 101 are connected to each, and four of the signal detecting circuits 105 are also provided and 256 of the signal lines 3 are connected to each.

An amplification circuit, that amplifies the inputted electric signal, is built into the signal detecting circuit 105 for each of the signal lines 3. At the signal detecting circuit 105, the electric signals inputted from the respective signal lines 3 are amplified by the amplification circuits and converted into digital data.

A control section 106 is connected to the signal detecting circuits 105 and the scan signal control circuits 104. The control section 106 carries out predetermined processes, such as noise removal and the like, on the digital data converted at the signal detecting circuits 105, and outputs control signals expressing signal detection timings to the signal detecting circuits 105, and outputs control signals expressing scan signal output timings to the scan signal control circuits 104.

The control section 106 of the present exemplary embodiment is configured by a microcomputer, and has a CPU (central processing unit), a ROM, a RAM, and a non-volatile storage section formed from a flash memory or the like. The control section 106 carries out, on the image information that was subjected to the aforementioned predetermined processes, the process of interpolating image information of the respective pixels 20B for radiation detection (interpolation processing), and generates the image that the irradiated radiation expresses. Namely, the control section 106 generates the image that the irradiated radiation expresses, by interpolating image information of the respective pixels 20 for radiation detection on the basis of the image information that was subjected to the aforementioned predetermined processes.

Figure 2:
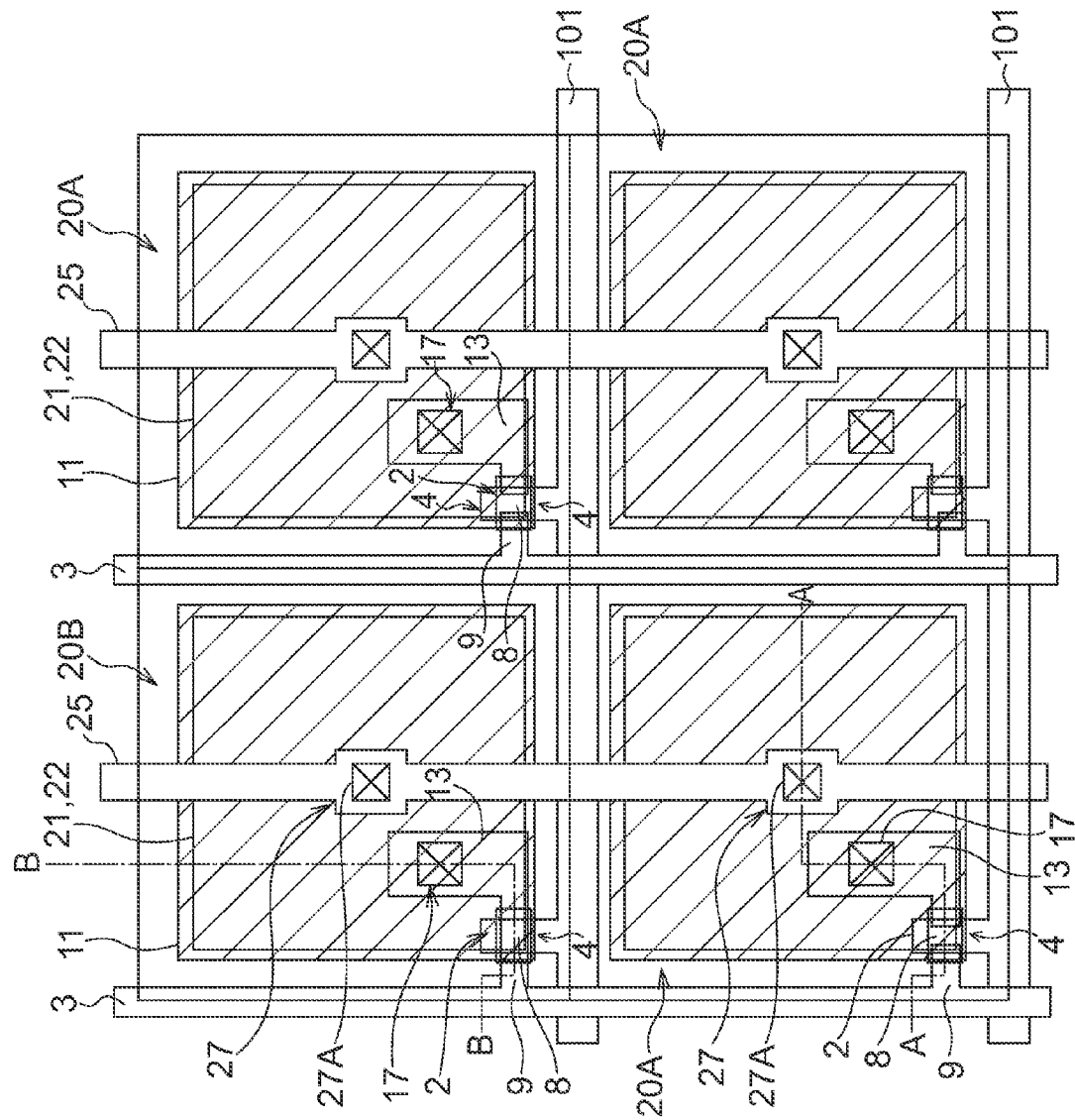
FIG. 2 is a plan view showing the configuration of a radiation detecting element relating to the first exemplary embodiment.
Figure 3:
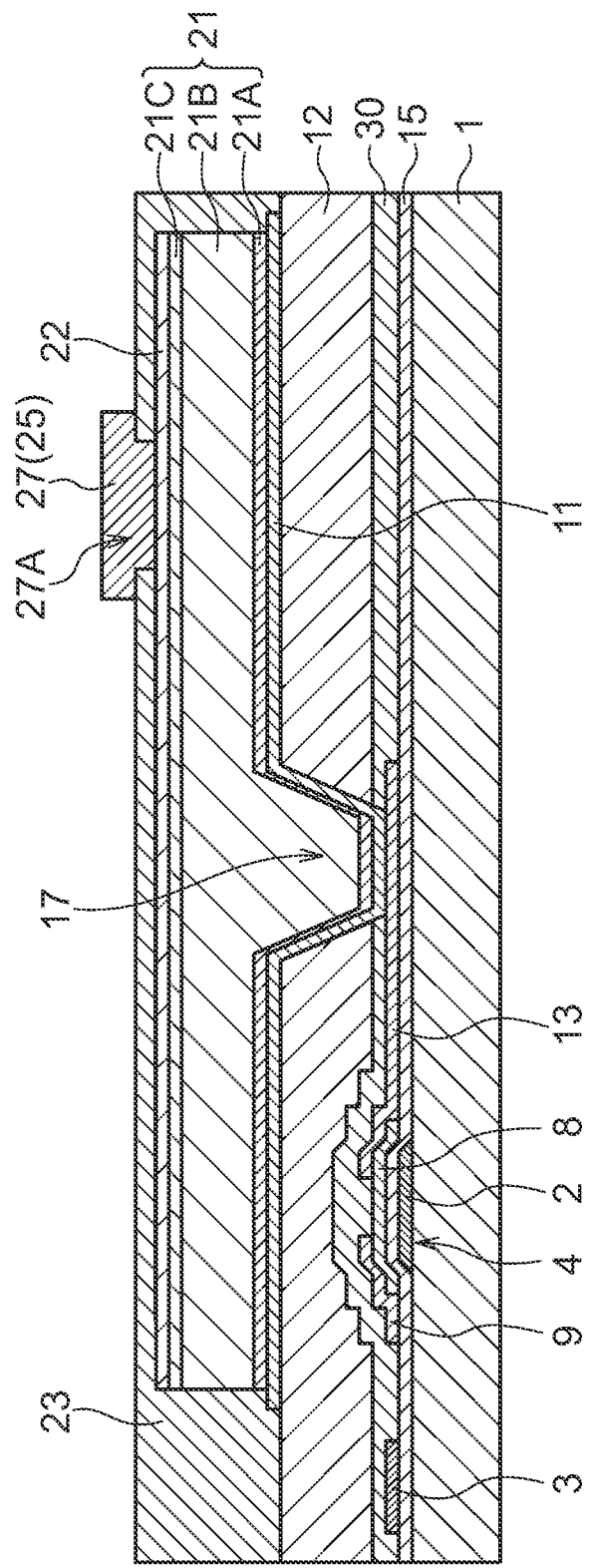
FIG. 3 is a line sectional view of the radiation detecting element relating to the first exemplary embodiment.
Figure 4:
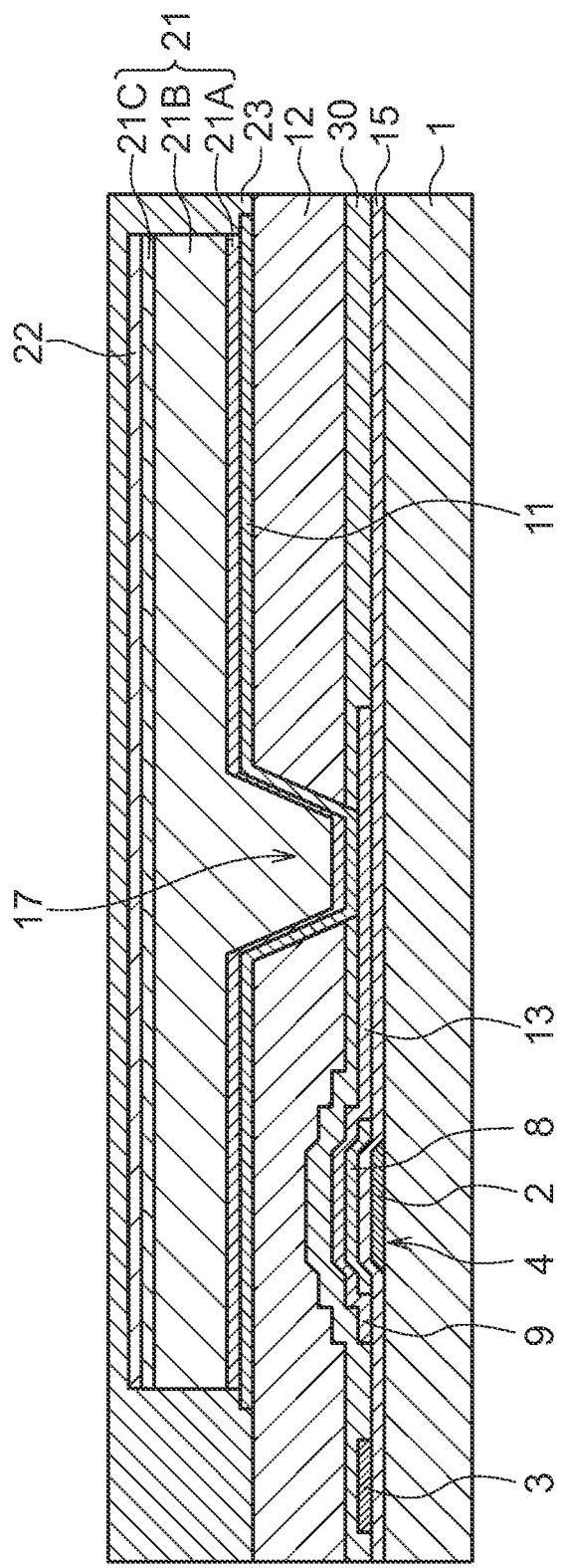
FIG. 4 is a line sectional view of the radiation detecting element relating to the first exemplary embodiment.

A plan view showing the configuration of the indirect-conversion-type radiation detecting element 10 relating to the present exemplary embodiment is shown in FIG. 2. A line A-A sectional view of the radiographic imaging pixel 20A of FIG. 2 is shown in FIG. 3. A line B-B sectional view of the radiation detection pixel 20B of FIG. 2 is shown in FIG. 4.

As shown in FIG. 3, at the radiation imaging pixel 20A of the radiation detecting element 10, the scan line 101 (see FIG. 2) and a gate electrode 2 are formed on an insulating substrate 1 that is formed from alkaline-free glass or the like, and the scan line 101 and the gate electrode 2 are connected (see FIG. 2). The wiring layer at which the scan line 101 and the gate electrode 2 are formed (hereinafter, this wiring layer is also called a "first signal wiring layer") is formed by using Al or Cu, or a layered film formed mainly of Al or Cu. However, the materials of the first signal wiring layer is not limited to these.

An insulating film 15 is formed on the entire surface on this first signal wiring layer. The region of the insulating film 15 that is positioned above the gate electrode 2 works as a gate insulating film at the TFT switch 4. The insulating film 15 is formed of, for example, $SiN_X$ or the like, and by, for example, CVD (Chemical Vapor Deposition).

Semiconductor active layers 8 are formed as islands above the gate electrodes 2 on the insulating film 15. The semiconductor active layer 8 is the channel portion of the TFT switch 4, and is formed from, for example, an amorphous silicon film.

A source electrode 9 and a drain electrode 13 are formed at the upper layer of these. Together with the source electrodes 9 and the drain electrodes 13, the signal lines 3 are formed at the wiring layer at which the source electrodes 9 and the drain electrodes 13 are formed. The source electrodes 9 are connected to the signal lines 3 (see FIG. 2). The wiring layer in which the source electrodes 9, the drain electrodes 13 and the signal lines 3 are formed (hereinafter, this wiring layer is also called a "second signal wiring layer") is formed by using Al or Cu, or a layered film formed mainly of Al or Cu. However, the formation of the wiring layer is not limited to these. An impurity-added semiconductor layer (not illustrated) formed of an impurity-added amorphous silicon or the like is formed between, on the one hand, the source electrode 9 and the drain electrode 13, and, on the other hand, the semiconductor active layer 8. The TFT switch 4 for switching is configured by these. Note that, at the TFT switch 4, the source electrode 9 and the drain electrode 13 are opposite due to the polarity of the charges that are collected and accumulated by a lower electrode 11 that is described below.

A TFT protecting film layer 30 is formed on substantially the entire surface of the region that covers the second signal wiring layer and where the pixels 20 are provided on the substrate 1 (substantially the entire region), so as to protect the TFT switches 4 and the signal lines 3. The TFT protecting film layer 30 is formed of, for example, $SiN_x$ or the like, and by, for example, CVD.

A coating-type interlayer insulating film 12 is formed on the TFT protecting film layer 30. The interlayer insulating film 12 is formed to a film thickness of 1 to 4 µm from a photosensitive organic material (e.g., a positive photosensitive acrylic resin: a material in which a naphthoquinonediazide positive photosensitive agent is mixed together with a base polymer formed from a copolymer of methacrylic acid and glycidyl methacrylate, or the like) having a low permittivity (dielectric constant $\in_r$=2 to 4).

In the radiation detecting element 10 relating to the present exemplary embodiment, the capacity between the metals that are disposed at the upper layer and the lower layer of the interlayer insulating film 12 is kept low by the interlayer insulating film 12. Further, generally, such a material also functions as a flattening film, and also has the effect of flattening the steps of the lower layer. In the radiation detecting element 10 relating to the present exemplary embodiment, contact holes 17 are formed in the interlayer insulating film 12 and the TFT protecting film layer 30 at positions opposing the drain electrodes 13.

The lower electrode 11 of the sensor portion 103 is formed on the interlayer insulating film 12, so as to cover the pixel region while filling-in the contact hole 17. The lower electrode 11 is connected to the drain electrode 13 of the TFT switch 4. If a semiconductor layer 21 that is described later is thick and around 1 µm, there are hardly any limitations on the material of the lower electrode 11 provided that it is electrically-conductive. Therefore, there are no problems with forming the lower electrode 11 by using an electrically-conductive metal such as an Al-type material, ITO, or the like.

On the other hand, if the film thickness of the semiconductor layer 21 is thin (around 0.2 to 0.5 µm), the absorption of light at the semiconductor layer 21 is insufficient. Therefore, in order to prevent an increase in leak current due to the illumination of light onto the TFT switch 4, it is preferable to make the semiconductor layer 21 be an alloy that is formed mainly of a light-shielding metal, or a layered film.

The semiconductor layer 21 that functions as a photodiode is formed on the lower electrode 11. In the present exemplary embodiment, a photodiode of a PIN configuration, in which an n+ layer, an i layer, and a p+ layer (n+ amorphous silicon, amorphous silicon, p+ amorphous silicon) are layered, is employed as the semiconductor layer 21, and is formed by layering an n+ layer 21A, an i layer 21B, and a p+ layer 21C in that order from the lower layer. At the i layer 21B, charges (pairs of a free electron and a free hole) are generated due to light being illuminated. The n+ layer 21A and the p+ layer 21C function as contact layers, and electrically connect the lower electrode 11 and an upper electrode 22, that is described hereinafter, with the i layer 21B.

Further, in the present exemplary embodiment, the lower electrode 11 is made to be larger than the semiconductor layer 21, and further, the light illumination side of the TFT switch 4 is covered by the semiconductor layer 21. Due thereto, the proportion of the surface area within the pixel region at which the light can be received (the so-called fill factor) is large, and further, incidence of light onto the TFT switch 4 is suppressed.

The upper electrode 22 is formed individually on each of the semiconductor layers 21. A material having high light transmittance such as, for example, ITO or IZO (indium zinc oxide) or the like, is used as the upper electrode 22. In the radiation detecting element 10 relating to the present exemplary embodiment, the sensor portion 103 is configured so as to include the upper electrode 22, the semiconductor layer 21, and the lower electrode 11.

A coating-type interlayer insulating film 23 is formed on the interlayer insulating film 12, the semiconductor layers 21 and the upper electrodes 22 so as to cover the respective semiconductor layers 21. The interlayer insulating film 23 has openings 27A at portions thereof corresponding to the upper electrodes 22.

The common electrode lines 25 are formed on the interlayer insulating film 23, of Al or Cu, or an alloy formed mainly of Al or Cu, or by a layered film. Contact pads 27 are formed in vicinities of the openings 27A, and the common electrode lines 25 are electrically connected to the upper electrodes 22 via the openings 27A of the interlayer insulating film 23.

On the other hand, as shown in FIG. 4, at the radiation detection pixel 20B of the radiation detecting element 10, the TFT switch 4 is formed such that the source electrode 9 and the drain electrode 13 contact. Namely, at the radiation detection pixel 20B, the source and the drain of the TFT switch 4 are short-circuited. Due thereto, at the radiation detection pixel 20B, the charges collected by the lower electrode 11 flow-out to the signal line 3 regardless of the state of switching of the TFT switch 4.

In the radiation detecting element 10 that is formed in this way, as needed, a protective film is further formed from an insulating material having low light absorbance. A scintillator formed from GOS or the like is adhered to the surface thereof by using an adhesive resin having low light absorbance.

Figure 5:
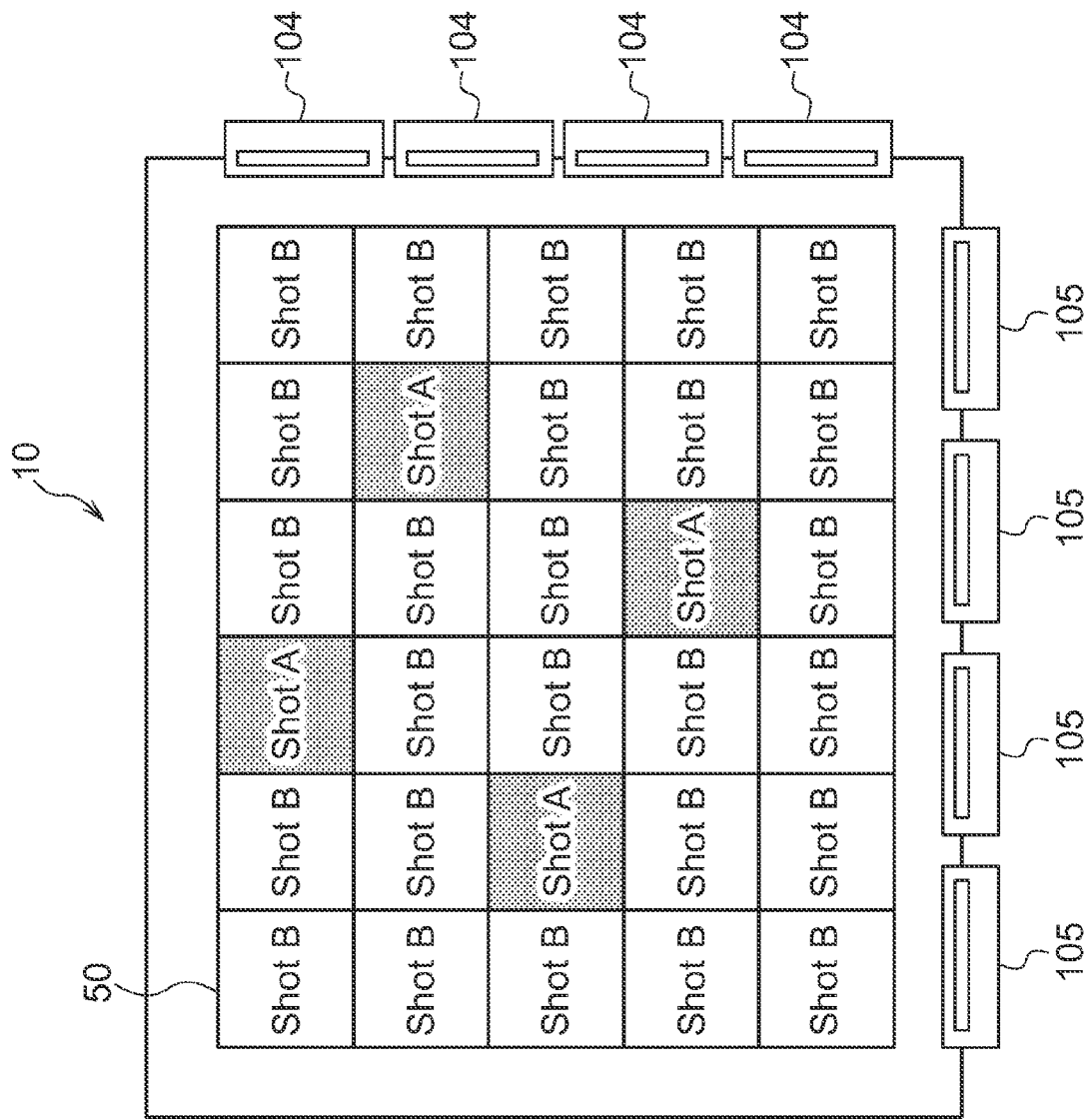
FIG. 5 is a drawing for explaining a method of designing the radiation detecting element relating to the first exemplary embodiment.

An example of the method of forming the pixels radiation detection 20B is described next. When the active area of the radiation detecting element 10 is larger than the photomask, as shown in FIG. 5, an active area 50 is divided, and exposure is carried out per divisional region. Note that, in the example of FIG. 5, the active area 50 is divided into 5×6 shots. The respective regions that have been divided are shown in FIG. 5. In the present exemplary embodiment, at the time of forming the second signal wiring layer of the radiation detecting element 10, exposure is carried out by using two types of photomasks. At the "Shot A" regions, exposure is carried out by using a photomask that is formed such that the source electrode 9 and the drain electrode 13 contact at some of the pixels 20. At the "Shot B" regions, exposure is carried out by using a photomask that is formed such that the source electrode 9 and the drain electrode 13 are separated at the respective pixels 20. At this time, it is desirable that the photomask for Shot A is formed such that the radiation detection pixels 20B are disposed at intervals of one pixel or more and are not disposed successively. Due thereto, the image quality of the image generated by the interpolation processing at the control section 106 is good as compared with a case in which the radiation detection pixels 20B are disposed successively.

Here, at the radiation detecting element 10, as shown in FIG. 6, it is preferable that the radiation detection pixels 20B are formed such that a plurality thereof are disposed with respect to specific signal lines 3 (here, D2 and D6). Although not illustrated in FIG. 6, when 1024 of the signal lines 3 are provided, for example, 16 of the radiation detection pixels 20B are formed at each of eight of the signal lines 3 that are set apart each 128 lines, so that the positions at which the radiation detection pixels 20B are disposed are uniform. In this case, there are 128 of the radiation detection pixels 20B. When there are 1024×1024 of the pixels 20, 0.01% of the entire number thereof are the radiation detection pixels 20B. The proportion of the radiation detection pixels 20B with respect to all of the pixels 20 is not limited to this, and various proportions can be considered. The proportion can be determined on the basis of the accuracy of the interpolation processing at the control section 106, or the like. For example, when the image quality of the image generated by the interpolation processing is good, the proportion of the radiation detection pixels 20B with respect to all of the pixels 20 may be, for example, around 1%, or the ratio may be made to be higher.

Figure 7:
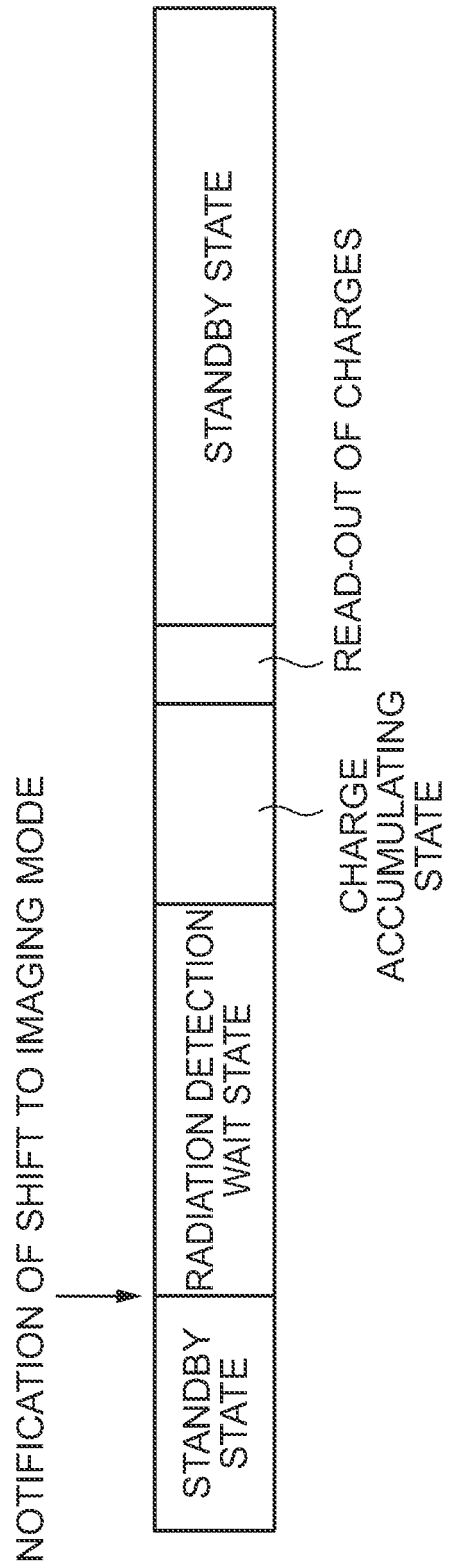
FIG. 7 is a schematic diagram schematically showing the flow of operations at the time of imaging a radiographic image of the radiographic imaging device relating to the exemplary embodiments.

Next, the flow of operations at the time of imaging a radiographic image by the radiographic imaging device 100 of the above-described configuration is briefly described by using FIG. 7.

At the radiation detecting element 10, even in a state in which radiation is not being irradiated, charges are generated due to dark current or the like, and the charges are accumulated in the respective pixels 20. Therefore, in the radiographic imaging device 100, a resetting operation of extracting and eliminating the charges that have accumulated in the respective pixels 20 of the radiation detecting element 10 is repeatedly carried out even during the standby state.

Figure 8:
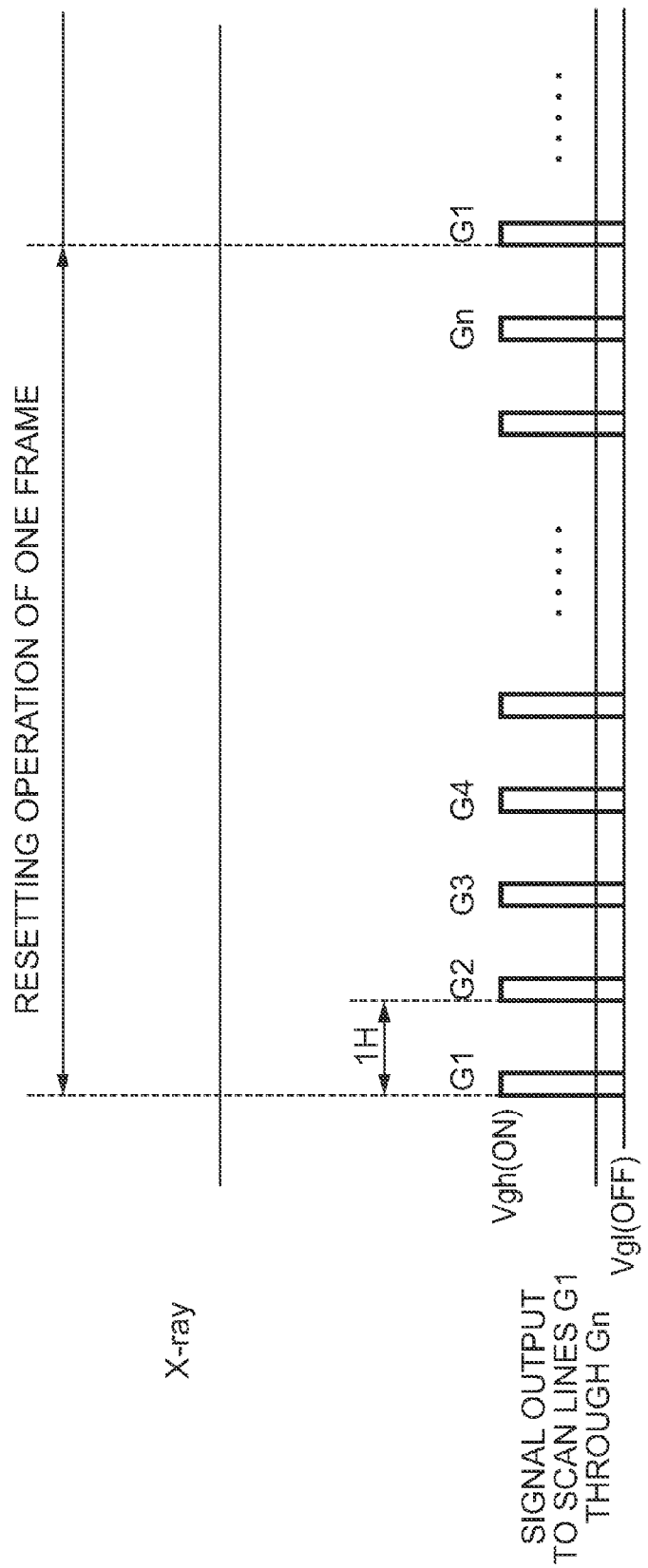
FIG. 8 is a time chart showing in detail the flow of operations in a standby state of the radiographic imaging device relating to the first exemplary embodiment.

A timing chart showing the flow of operations in the standby state of the radiographic imaging device 100 relating to the present exemplary embodiment is shown in FIG. 8.

In the case of the standby state, the control section 106 controls the scan signal control circuits 104 and carries out extracting of charges by causing on signals (signals of potential VgH) to be outputted from the scan signal control circuits 104 to the respective scan lines 101 in order and line-by-line, and turning ON, in order and line-by-line, the respective TFT switches 4 that are connected to the respective scan lines 101. Due thereto, the charges accumulated in the respective pixels 20 flow-out, in order and line-by-line, to the respective signal lines 3 as electric signals. While the operating state is the standby state, after a predetermined time period passes, the control section 106 repeats the resetting operation that resets one frame by causing on signals to be outputted to the respective scan lines 101 in order and line-by-line and extracting the charges accumulated in the respective pixels 20 of the radiation detecting element 10.

Due to this resetting operation, electric signals (so-called offset), that are due to charges that are generated by dark current or the like even when radiation is not being irradiated, flow to the respective signal lines 3. The information due to the charges that are read-out in this resetting operation is used to correct the offset that arises in the radiographic image due to dark current or the like.

The radiographic imaging device 100 performs a radiographic imaging by detecting the start of irradiation of radiation and starting accumulation of charges at the respective pixels 20 of the radiation detecting element 10. At the time of carrying out imaging of a radiographic image, as shown in FIG. 7, the radiographic imaging device 100 is notified of a shift to an imaging mode.

When the radiographic imaging device 100 is notified of the shift to the imaging mode, the radiographic imaging device 100 shifts to a radiation detection wait state in which detection of radiation is carried out, and, when radiation is detected, shifts to a charge accumulating state in which charges are accumulated at the radiation detecting element 10, and, after a predetermined time from the detecting of the radiation, shifts to a charge read-out state in which the accumulated charge are read-out, and, after reading-out of the charges ends, shifts to the standby state.

Figure 9:
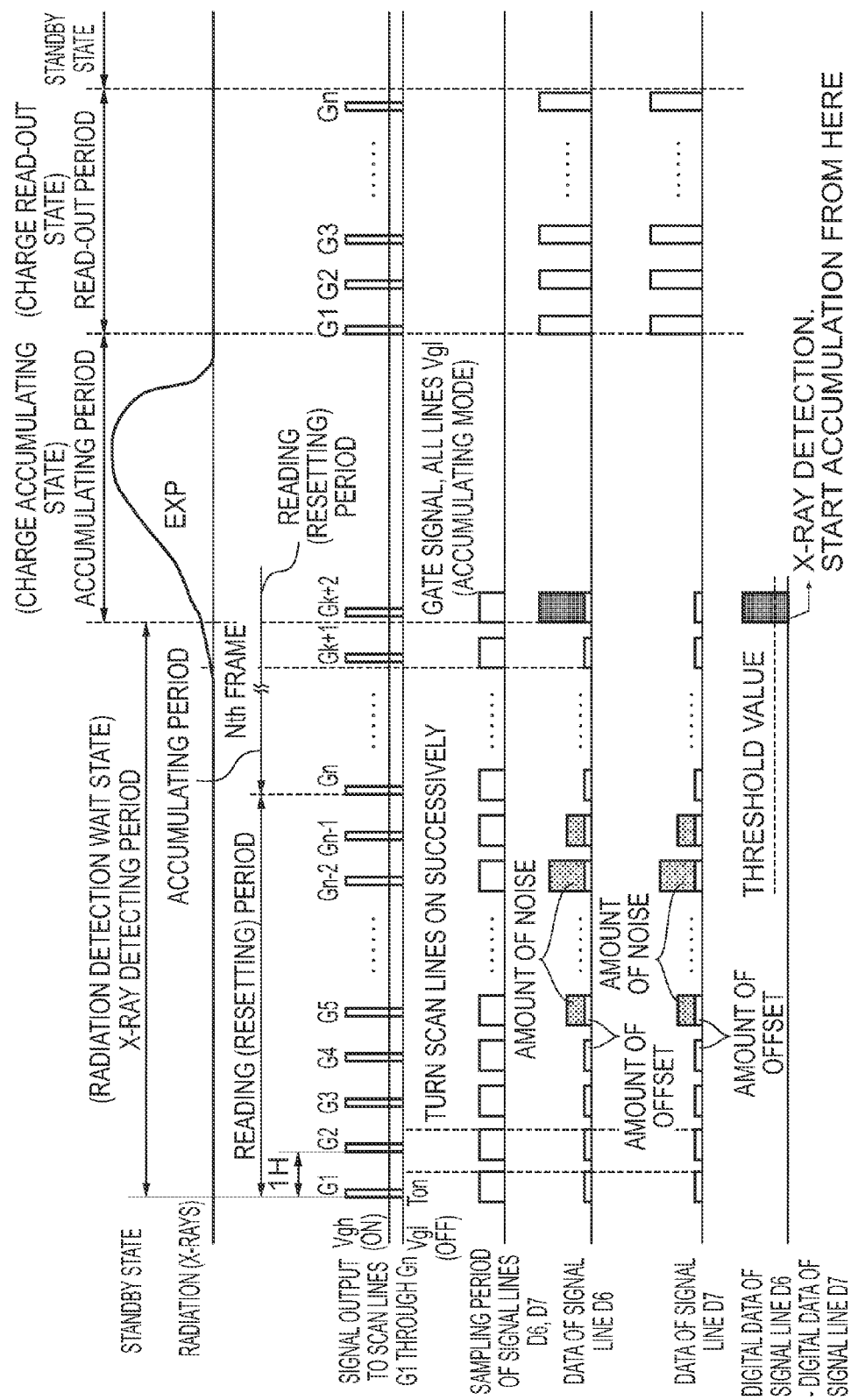
FIG. 9 is a time chart showing in detail the flow of operations at the time of imaging a radiographic image of the radiographic imaging device relating to the first exemplary embodiment.

A timing chart showing the flow of operations at the time of imaging a radiographic image by the radiographic imaging device 100 relating to the first exemplary embodiment is shown in FIG. 9.

When the control section 106 is notified of the shift to the imaging mode, the control section 106 shifts to the radiation detection waiting state, and controls the scan signal control circuits 104 such that sampling, in which off signals (signals of potential Vg1) are outputted from the scan signal control circuits 104 to the respective scan lines 101, and the electric signals flowing to the signal line 3 to which the radiation detection pixels 20B are connected (in the case of FIG. 6, at least one of D2 and D6, for example, D6) are converted into digital data by the signal detecting circuit 105 at a predetermined period 1H, and detection of radiation is carried out, is repeated. Note that, the predetermined period 1H is made to be the same as the period with respect to one line at the time of carrying out reading-out of the image or the resetting operation due to on signals being outputted from the scan signal control circuits 104 to the respective scan lines 101 in order and line-by-line. However, the predetermined period 1H does not have to be the same as this, and may be made to be shorter than the period with respect to one line at the time of carrying out reading-out of the image or the resetting operation.

If the wait period for detecting radiation is long, charges are accumulated in the respective pixels 20 due to dark current or the like. Thus, in the present exemplary embodiment, the control section 106 controls the scan signal control circuits 104 such that a resetting operation is carried out in which, in the same way as in the standby state, on signals are outputted from the scan signal control circuits 104 to the respective scan lines 101 in order and line-by-line, and the respective TFT switches 4 connected to the respective scan lines 101 are turned ON in order and line-by-line, and the charges accumulated in the respective pixels 20 of the radiation detecting element 10 are taken-out.

The radiographic imaging device 100 is disposed so as to be separated by an interval from a radiation generating device that generates radiation, and the radiation that has passed through a subject is irradiated onto the radiographic imaging device 100.

When radiation is irradiated, the irradiated radiation is absorbed by the scintillator and converted into visible light. Note that radiation may be irradiated from either the obverse side or the reverse side of the radiation detecting element 10. The light, that is converted into visible light at the scintillator, is illuminated onto the sensor portions 103 of the respective pixels 20.

At the sensor portion 103, when light is illuminated, charges are generated at the interior of the sensor portion 103. The generated charges are collected by the lower electrode 11.

At the pixels 20A, because the drain electrode 13 and the source electrode 9 are not short-circuited, the charges that are collected by the lower electrode 11 are accumulated. However, at the radiation detection pixels 20B, because the drain electrode 13 and the source electrode 9 are short-circuited, the charges collected by the lower electrode 11 flow-out to the signal line 3. In particular, in the present exemplary embodiment, as shown in FIG. 6, the radiation detection pixels 20B are selectively disposed with respect to the specific signal lines 3 (here, the D2 and D6 signal lines 3). The electric signals that flow-out from the radiation detection pixels 20B are multiplied per that specific signal line 3. Namely, by placing the plural pixels 20B at the specific signal line 3, the change in the level of the electric signal due to the radiation becomes large.

At the radiation detecting element 10, there are cases in which noise arises at the respective signal lines 3 due to any of various external disturbances such as shock, temperature or the like. Accordingly, there are cases in which offset due to dark current or the like and noise due to an external disturbance are included in the electric signals that flow through the respective signal lines 3. In particular, noise that arises due to an external disturbance has the characteristic that changes in the electric signal also are great.

Thus, in the present exemplary embodiment, as shown in FIG. 9, sampling, in which the electric signals that flow to the signal line 3 (in the case of FIG. 6, at least one of D2 and D6, and here, D6) to which the radiation detection pixels 20B are connected, and also the electric signals that flow to the signal line 3 to which the radiation detection pixels 20B are not connected (in the case of FIG. 6, D1, D3 through D5, D7, D8, and here, D7), are converted into digital data, and detection of radiation is carried out, is repeated by the signal detecting circuits 105 at the predetermined period 1H. For the signal line 3 on which sampling is carried out together with the signal line 3 to which the radiation detection pixels 20B are connected, if the noise that is generated at the respective signal lines 3 is similar, any of the signal lines 3 may be used provided that the radiation detection pixels 20B are not connected thereto. However, if there is non-uniformity in the noise that is generated due to the positions of the signal lines 3 within the radiation detecting element 10, it is preferable that the signal line 3, on which sampling is carried out together with the signal line 3 to which the radiation detection pixels 20B are connected, be near to the signal line 3 that is the object of sampling and to which the radiation detection pixels 20B are connected, and be connected to the same signal detecting circuit 105 as that signal line 3. In the present exemplary embodiment, sampling of the D7 signal line 3, that is disposed adjacent to the D6 signal line 3 that is the object of sampling to which the radiation detection pixels 20B are connected, is carried out by the signal detecting circuit 105. The signal detecting circuit 105 amplifies, by respective amplification circuits, the electric signals flowing through the D6 signal line 3 and the D7 signal line 3, and converts them into digital data, and outputs the digital data to the control section 106.

At the control section 106, the value of the digital data, that was converted by the signal detecting circuit 105, of the D7 signal line 3 to which the radiation detection pixels 20B are not connected, is subtracted from the value of the digital data, that was converted by the signal detecting circuit 105, of the D6 signal line 3 to which the radiation detection pixels 20B are connected. The digital data value that is the resulting difference is compared with a predetermined threshold value for radiation sensing. In accordance with whether or not this digital data value is greater than or equal to the threshold value, it is detected whether or not radiation is irradiated.

Figure 10:
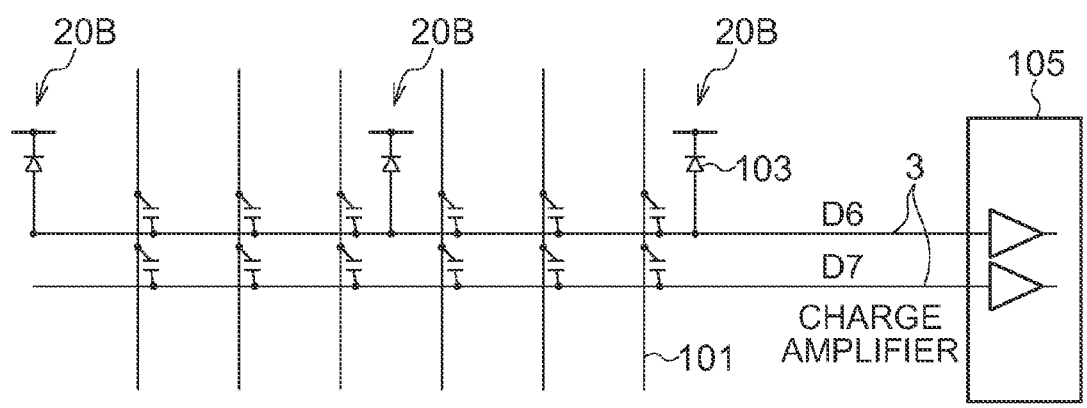
FIG. 10 is an equivalent circuit diagram that focuses on the D6 and D7 signal lines 3 of the radiation detecting element relating to the first exemplary embodiment.

An equivalent circuit diagram that focuses on the D6 and D7 signal lines 3 of the radiation detecting element 10 relating to the present exemplary embodiment is shown in FIG. 10. Note that, in FIG. 10, the capacities due to the signal lines 3 and the scan lines 101 intersecting are illustrated as capacitors at the respective intersecting portions.

When noise is generated due to an external disturbance at the respective signal lines 3, substantially the same noise is generated at the D6 and D7 signal lines 3 because they are adjacent to one another. Further, when radiation is irradiated, electric signals from the radiation detection pixels 20B also flow to the D6 signal line 3.

Therefore, the electric signals that flow through the D6 and D7 signal lines 3 are converted into digital data, and, by subtracting the value of the converted digital data of the D7 signal line 3 from the value of the converted digital data of the D6 signal line 3, a value corresponding to the amount of noise can be cancelled.

When the irradiation of radiation is detected, as shown in FIG. 9, after a predetermined accumulating time period elapses, the control section 106 controls the scan signal control circuits 104, and causes on signals to be outputted from the scan signal control circuits 104 to the respective scan lines 101 in order and line-by-line, and successively applies ON signals to the gate electrodes 2 of the TFT switches 4 via the scan lines 101. Due thereto, the TFT switches 4 of the plural, arranged pixels 20A are successively turned on, and electric signals corresponding to the charge amounts accumulated in the respective pixels 20A flow-out to the signal lines 3. The signal detecting circuits 105 convert the electric signals that flow to the respective signal lines 3 into digital data. The control section 106 carries out predetermined processes on the converted digital data, and, on the image information that has been subjected to the predetermined processes, carries out processes that interpolates the image information of the respective pixels 20B for radiation detection, and generates the image that the irradiated radiation expresses.

In this way, in accordance with the present exemplary embodiment, even when noise arises due to an external disturbance or the like, the effects of noise are suppressed and radiation can be detected accurately. Due thereto, even when noise arises at the respective signal lines 3, there is no need to set the threshold value for radiation sensing to be high in consideration of the amount of noise. Therefore, the start of irradiation of the radiation may be detected earlier.

Further, in accordance with the present exemplary embodiment, by providing the radiographic imaging pixels 20A and the radiation detection pixels 20B at the imaging region of the radiation detecting element 10 at which a radiographic image can be captured, radiation may be reliably detected even when the region over which the radiation is irradiated is set to be narrow.

Moreover, in accordance with the present exemplary embodiment, detection of irradiation of radiation also may be carried out at the signal detecting circuits 105 for radiographic imaging. Therefore, there is no need to separately provide a detecting circuit exclusively used therefor.

In accordance with the present exemplary embodiment, the radiation detection pixels 20B are made to be the same shape as the radiographic imaging pixels 20A, and the radiation detection pixels 20B are disposed so as to be scattered. Due thereto, the occurrence of artifacts and a deterioration in the image quality of the radiographic image that is imaged may be prevented.

Further, at the radiographic imaging device 100 relating to the present exemplary embodiment, at the radiation detection pixels 20B, the electric signals flow-out to the signal lines 3 regardless of the switched states of the TFT switches 4. Therefore, detection of radiation by sampling of the signal detecting circuits 105 may be possible even in the off period when off signals are outputted from the scan signal control circuits 104 to the respective scan lines 101.

Moreover, in the radiographic imaging device 100 relating to the present exemplary embodiment, the start of irradiation of radiation is detected, and accumulation of charges at the respective pixels 20 of the radiation detecting element 10 is started. Therefore, the radiation, that is irradiated during the time period until the irradiation of radiation is detected, does not contribute to the radiographic image. Because the irradiation time period of radiation during usual imaging is greater than or equal to 100 ms, and the predetermined period 1H is around 100 μs, the radiation that is irradiated may be utilized without hardly any loss.

Still further, in accordance with the present exemplary embodiment, by concentratedly disposing the plural (16 in the present exemplary embodiment) pixels 20B for radiation detection on the specific signal line 3, charges of an amount that is plural times (16 times in the present exemplary embodiment) that in a case in which only one of the radiation detection pixels 20B is provided can be obtained. Due thereto, the irradiation of radiation may be detected at the stage when the energy of the radiation is low, and operation can shift to the charging operation. Namely, loss of the radiation may be reduced. In particular, the response characteristic of X-rays is slow, and there are often cases in which high energy does not emerge in the initial stage of irradiation. Therefore, the accuracy of detection at the start of irradiating X-rays is improved by concentratedly disposing the plural pixels 20B for radiation detection on the specific signal line 3.

In accordance with the present exemplary embodiment, during the radiation detection wait period, electric signals due to the resetting operation also flow to the signal lines 3. However, because the plural pixels 20B for radiation detection are disposed at the specific signal line 3, it is easy to differentiate, from the level of the electric signals, between irradiation of radiation and the resetting operation.

Moreover, in accordance with the present exemplary embodiment, during the radiation detection wait period, resetting operation that is similar to the standby state is carried out. Therefore, the most recent data for offset correction can be acquired. There are cases in which the offset that is generated at the respective pixels 20 of the radiation detecting element 10 varies over time in accordance with the state of the radiation detecting element 10. Therefore, noise of the radiographic image may be reduced by carrying out correction that is based on the most recent data for offset correction.

Further, in accordance with the present exemplary embodiment, the resetting operation is stopped at the point in time when irradiation of radiation is detected. Therefore, the loss of radiation due to the resetting operation is kept to an amount corresponding to only one line. When there is little radiation at the point in time of the start of irradiation of the radiation, the proportion of the loss of the radiation is small, and therefore, it is also possible to use the image as is without carrying out interpolation processing. When a step arises in the image at the stopped line in the radiographic image due to stopping of the resetting operation, the step can be corrected by carrying out interpolation processing from the image information of the lines adjacent to the step.

[Second Exemplary Embodiment]

A second exemplary embodiment is described next.

Figure 11:
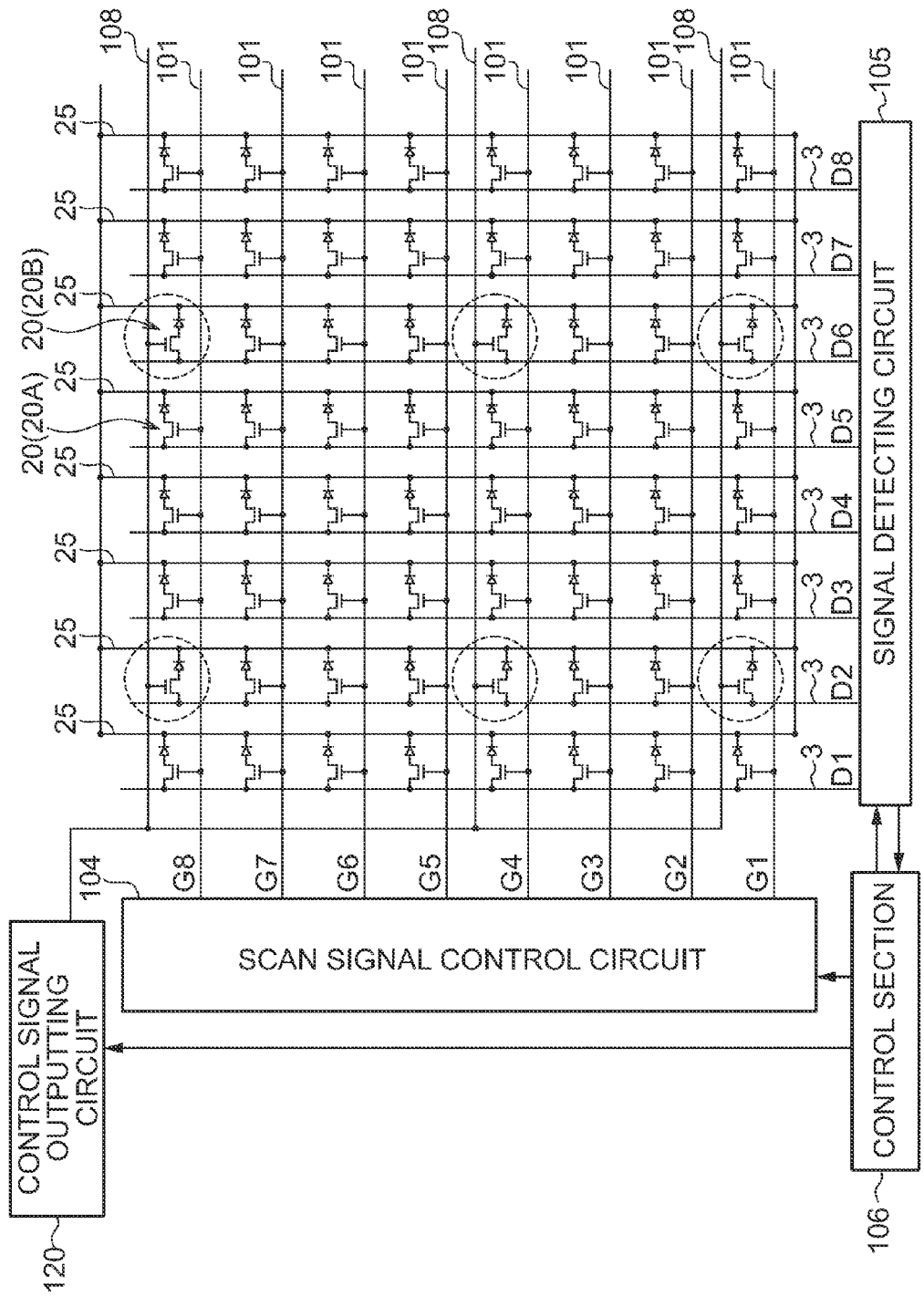
FIG. 11 is a drawing showing the overall configuration of a radiographic imaging device relating to a second exemplary embodiment.

The overall configuration of the radiographic imaging device 100 that uses the radiation detecting element 10 relating to the second exemplary embodiment is shown in FIG. 11. Note that portions that are the same as in the above-described first exemplary embodiment (see FIG. 1) are denoted by the same reference numerals, and description thereof is omitted.

In the radiation detecting element 10 relating to the second exemplary embodiment, scan lines 108 are provided in parallel to the scan lines 101 at the lines of pixels in one direction (the lateral direction in FIG. 11, hereinafter also called "row direction") at which the radiation detection pixels 20B are provided. Hereinafter, in the present exemplary embodiment, in order to distinguish between the scan lines 101 and the scan lines 108, the scan lines 101 are called the first scan lines 101, and the scan lines 108 are called the second scan lines 108.

Of the plural pixels 20, at the radiographic imaging pixels 20A, the gates of the TFT switches 4 are connected to the first scan lines 101, and, at the radiation detection pixels 20B, the gates of the TFT switches 4 are connected to the second scan lines 108. Further, at both the radiographic imaging pixels 20A and the radiation detection pixels 20B, the sources of the TFT switches 4 are connected to the signal lines 3.

Control signals for switching the TFT switches 4 of the radiographic imaging pixels 20A flow to the first scan lines 101. Control signals for switching the TFT switches 4 of the radiation detection pixels 20B flow to the second scan lines 108. Among the pixels 20, the TFT switches 4 of pixels 20A for radiographic imaging are switched due to control signals flowing to the respective first scan lines 101, and the TFT switches 4 of the radiation detection pixels 20B are switched by control signals flowing to the respective second scan lines 108.

Electric signals, that correspond to the charges accumulated in the respective pixels 20, flow to the signal lines 3 in accordance with the switched states of the TFT switches 4 of the respective pixels 20. More concretely, an electric signal corresponding to the accumulated charge amount flows to the signal line 3 due to any of the TFT switches 4 of the pixels 20 connected to that signal line 3 being turned ON.

The respective signal lines 3 are connected to the signal detecting circuits 105. The respective first scan lines 101 are connected to the scan signal control circuits 104 that output, to the respective first scan lines 101, control signals for turning the TFT switches 40N and OFF. One ends of the second scan lines 108 are connected in parallel, and these one ends are connected to a control signal outputting circuit 120 that outputs, to the respective second scan lines 108, control signals for turning the TFT switches 40N and OFF.

Note that, in FIG. 11, illustration is simplified by showing one of each of the signal detecting circuit 105 and the scan signal control circuit 104. However, for example, the plural signal detecting circuits 105 and the plural scan signal control circuits 104 are provided, and a predetermined number (e.g. 256) of the signal lines 3 or the first scan lines 101 are connected to each. For example, when 1024 of each of the signal lines 3 and the first scan lines 101 are provided, four of the scan signal control circuits 104 are provided and 256 of the first scan lines 101 are connected to each, and four of the signal detecting circuits 105 are also provided and 256 of the signal lines 3 are connected to each.

The control signal outputting circuit 120 is connected to the control section 106, and is operated by control from the control section 106, and outputs, to the respective second scan lines 108, control signals for turning the TFT switches 40N and OFF.

Figure 12:
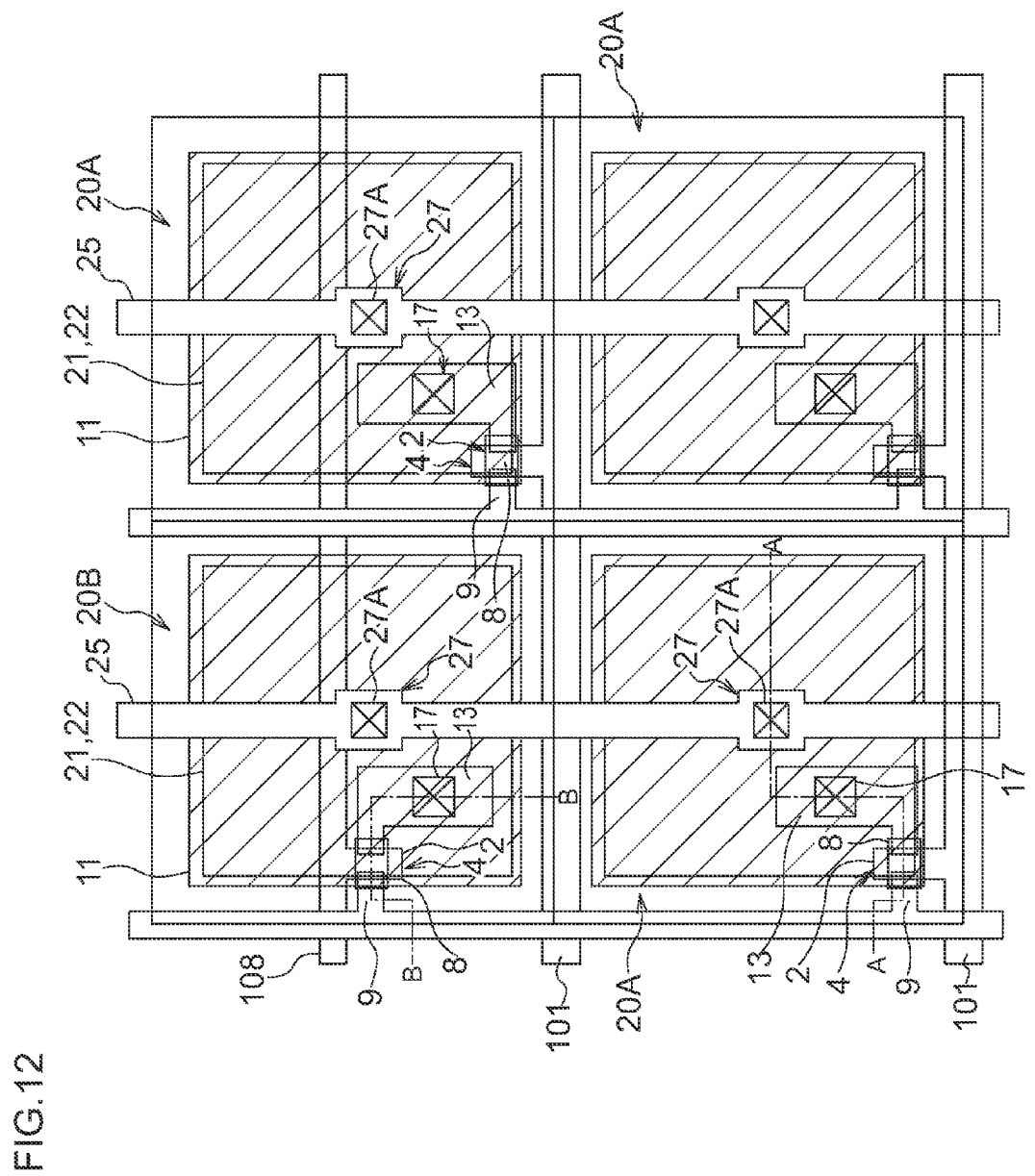
FIG. 12 is a plan view showing the configuration of a radiation detecting element relating to the second exemplary embodiment.
Figure 13:
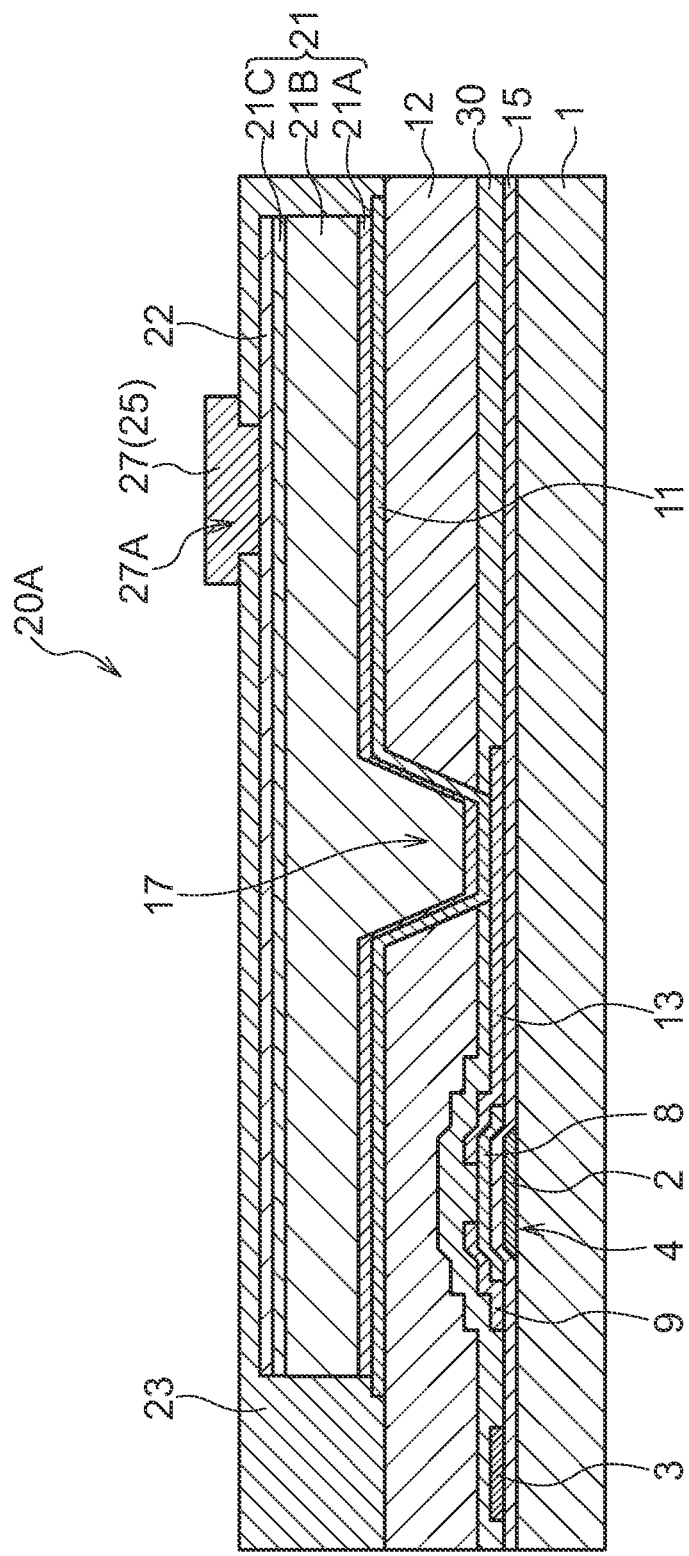
FIG. 13 is a line sectional view of the radiation detecting element relating to the second exemplary embodiment.
Figure 14:
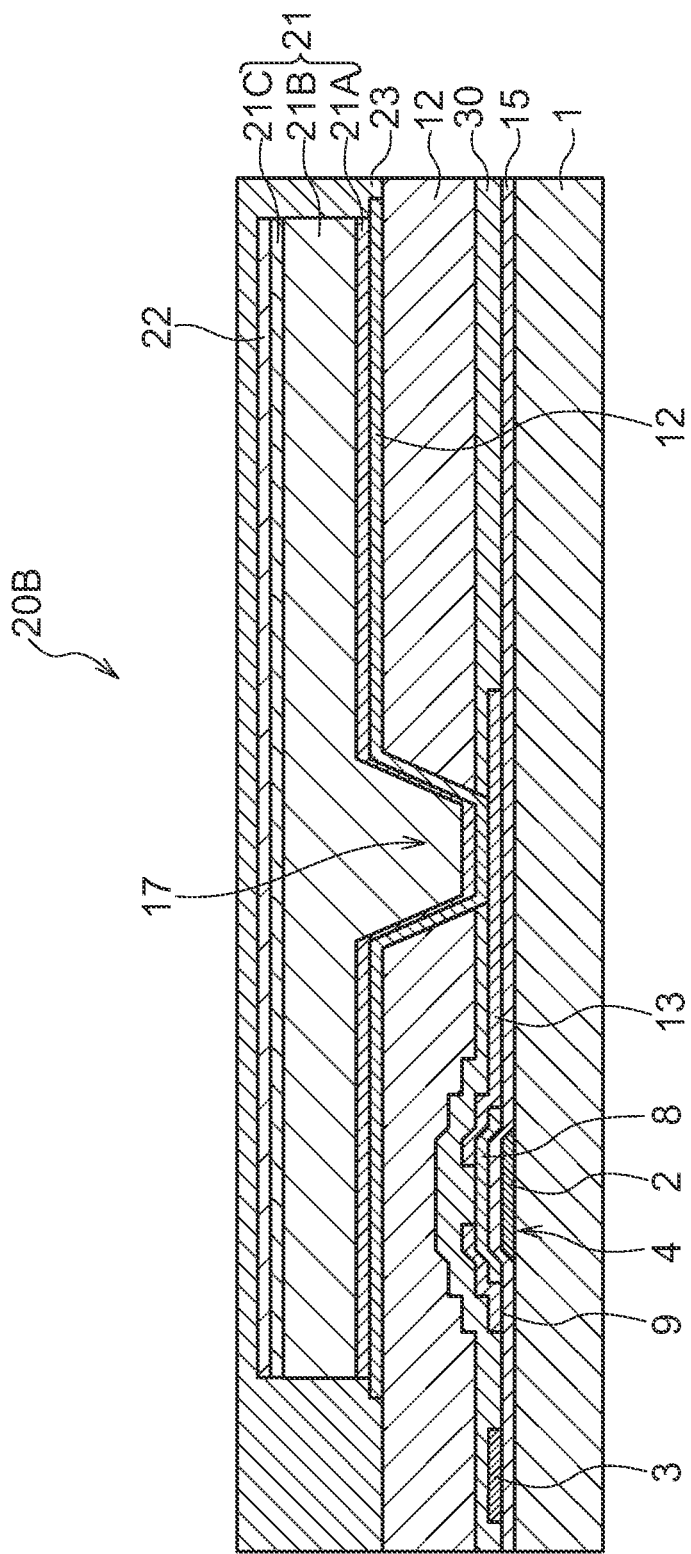
FIG. 14 is a line sectional view of the radiation detecting element relating to the second exemplary embodiment.

A plan view showing the configurations of four pixels that are three of the radiographic imaging pixels 20A and one of the radiation detection pixels 20B of the indirect-conversion-type radiation detecting element 10 relating to the second exemplary embodiment, is shown in FIG. 12. A line A-A sectional view of the radiographic imaging pixel 20A of FIG. 12 is shown in FIG. 13. A line B-B sectional view of the radiation detection pixel 20B of FIG. 12 is shown in FIG. 14. Note that portions that are the same as those of the above-described first exemplary embodiment (see FIG. 2 through FIG. 4) are denoted by the same reference numerals, and description thereof is omitted.

As shown in FIG. 13 and FIG. 14, at the radiographic imaging pixels 20A and the radiation detection pixels 20B, the first scan lines 101 (see FIG. 12) and the gate electrodes 2 are formed on the insulating substrate 1 as the first signal wiring layer. Further, at the radiation detection pixels 20B, the second scan lines 108 are formed as the first signal wiring layer. At the radiographic imaging pixels 20A, the gate electrodes 2 are connected to the first scan lines 101, and, at the radiation detection pixels 20B, the gate electrodes 2 are connected to the second scan lines 108 (see FIG. 12).

The insulating film 15 is formed on the entire surface on the first signal wiring layer. Respective layers are formed on the insulating film 15 in the same way as in the first exemplary embodiment (see FIG. 2 through FIG. 4).

Figure 15:
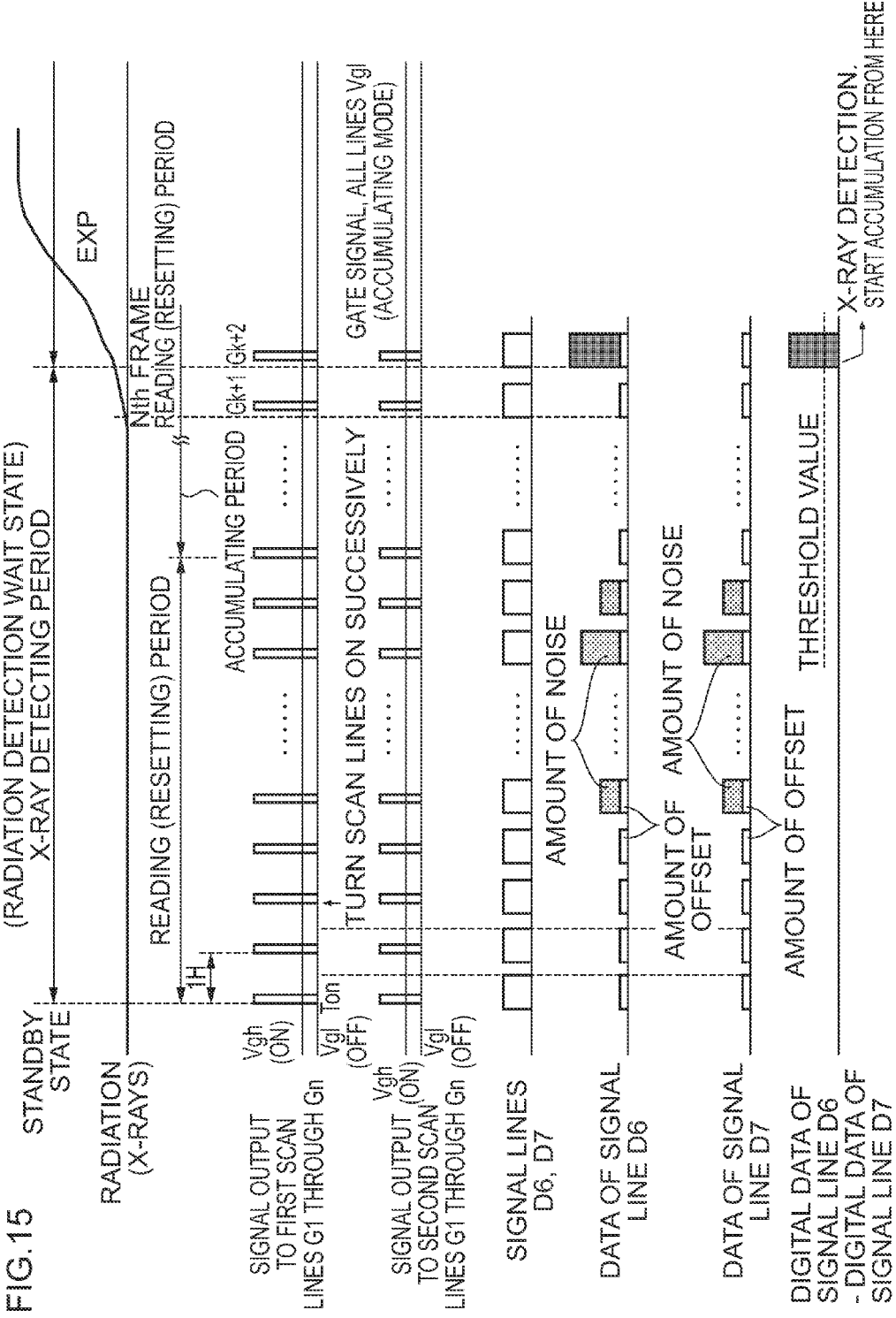
FIG. 15 is a time chart showing in detail the flow of operations at the time of imaging a radiographic image of the radiographic imaging device relating to the second exemplary embodiment.

A timing chart showing the flow of operations when a radiographic image is captured by the radiographic imaging device 100 relating to the second exemplary embodiment is shown in FIG. 15.

As described above, if the wait period for detecting radiation is long, charges are accumulated in the respective pixels 20 due to dark current or the like. Thus, in the case of the radiation detection wait state, the control section 106 controls the scan signal control circuits 104 such that a resetting operation is carried out in which on signals are outputted from the scan signal control circuits 104 to the respective first scan lines 101 in order and line-by-line, and the respective TFT switches 4 connected to the respective first scan lines 101 are turned ON in order and line-by-line, and the charges accumulated in the respective pixels 20 of the radiation detecting element 10 are extracted.

Further, the control section 106 controls the control signal outputting circuit 120 such that sampling, in which on signals are outputted from the control signal outputting circuit 120 to the respective second scan lines 108 at the predetermined period 1H, and the electric signals flowing to the signal line 3 to which the radiation detection pixels 20B are connected (in the case of FIG. 11, at least one of D2 and D6, and here, D6) and to the signal line 3 to which the radiation detection pixels 20B are not connected (in the case of FIG. 11, D1, D3 through D5, D7, D8, and here, D7), are converted into digital data and detection of radiation is carried out at the predetermined period 1H by the signal detecting circuit 105, is repeated. Note that, as described above, for the signal line 3 on which sampling is carried out together with the signal line 3 to which the radiation detection pixels 20B are connected, if the noise that is generated at the respective signal lines 3 is similar, any of the signal lines 3 may be used provided that the radiation detection pixels 20B are not connected thereto. However, if there is non-uniformity in the noise that is generated due to the positions of the signal lines 3 within the radiation detecting element 10, it is preferable that the signal line 3, on which sampling is carried out together with the signal line 3 to which the radiation detection pixels 20B are connected, be near to the signal line 3 that is the object of sampling and to which the radiation detection pixels 20B are connected, and be connected to the same signal detecting circuit 105 as that signal line 3. In the present exemplary embodiment, sampling of the D7 signal line 3, that is disposed adjacent to the D6 signal line 3 that is the object of sampling to which the radiation detection pixels 20B are connected, is carried out by the signal detecting circuit 105. The signal detecting circuit 105 amplifies, by respective amplification circuits, the electric signals flowing through the D6 signal line 3 and the D7 signal line 3, and converts them into digital data, and outputs the digital data to the control section 106.

At the control section 106, the value of the digital data, that was converted by the signal detecting circuit 105, of the D7 signal line 3 to which the radiation detection pixels 20B are not connected, is subtracted from the value of the digital data, that was converted by the signal detecting circuit 105, of the D6 signal line 3 to which the radiation detection pixels 20B are connected. The digital data value that is the resulting difference, is compared with a predetermined threshold value for radiation sensing. In accordance with whether or not this digital data value is greater than or equal to the threshold value, it is detected whether or not radiation is irradiated.

Due thereto, even when noise arises due to external disturbance at the D6 and D7 signal lines 3, the electric signals that flow through the D6 and D7 signal lines 3 are converted into digital data, and, by subtracting the value of the converted digital data of the D7 signal line 3 from the value of the converted digital data of the D6 signal line 3, a value corresponding to the amount of noise is cancelled.

In this way, in accordance with the present exemplary embodiment, even when noise arises due to an external disturbance or the like, the effects of noise are suppressed and radiation can be detected accurately. Due thereto, even when noise arises at the respective signal lines 3, there is no need to set the threshold value for radiation sensing to be high in consideration of the amount of noise. Therefore, the start of irradiation of the radiation may be detected earlier.

In the radiographic imaging device 100 relating to the present exemplary embodiment, the second scan lines 108 are provided in parallel to the first scan lines 101, and the gates of the TFT switches 4 of the radiation detection pixels 20B are connected to the second scan lines 108. Due thereto, at the radiation detection pixels 20B, the accumulated charges flow-out to the signal lines 3 as electric signals due to control signals from the second scan lines 108. Therefore, detection of radiation by sampling of the signal detecting circuits 105 is possible even during the off period in which off signals (signals of potential Vg1) are outputted from the scan signal control circuits 104 to the respective first scan lines 101, and during the resetting operation in which on signals are outputted in order to the respective first scan lines 101.

[Third Exemplary Embodiment]

A third exemplary embodiment is described next.

Figure 16:
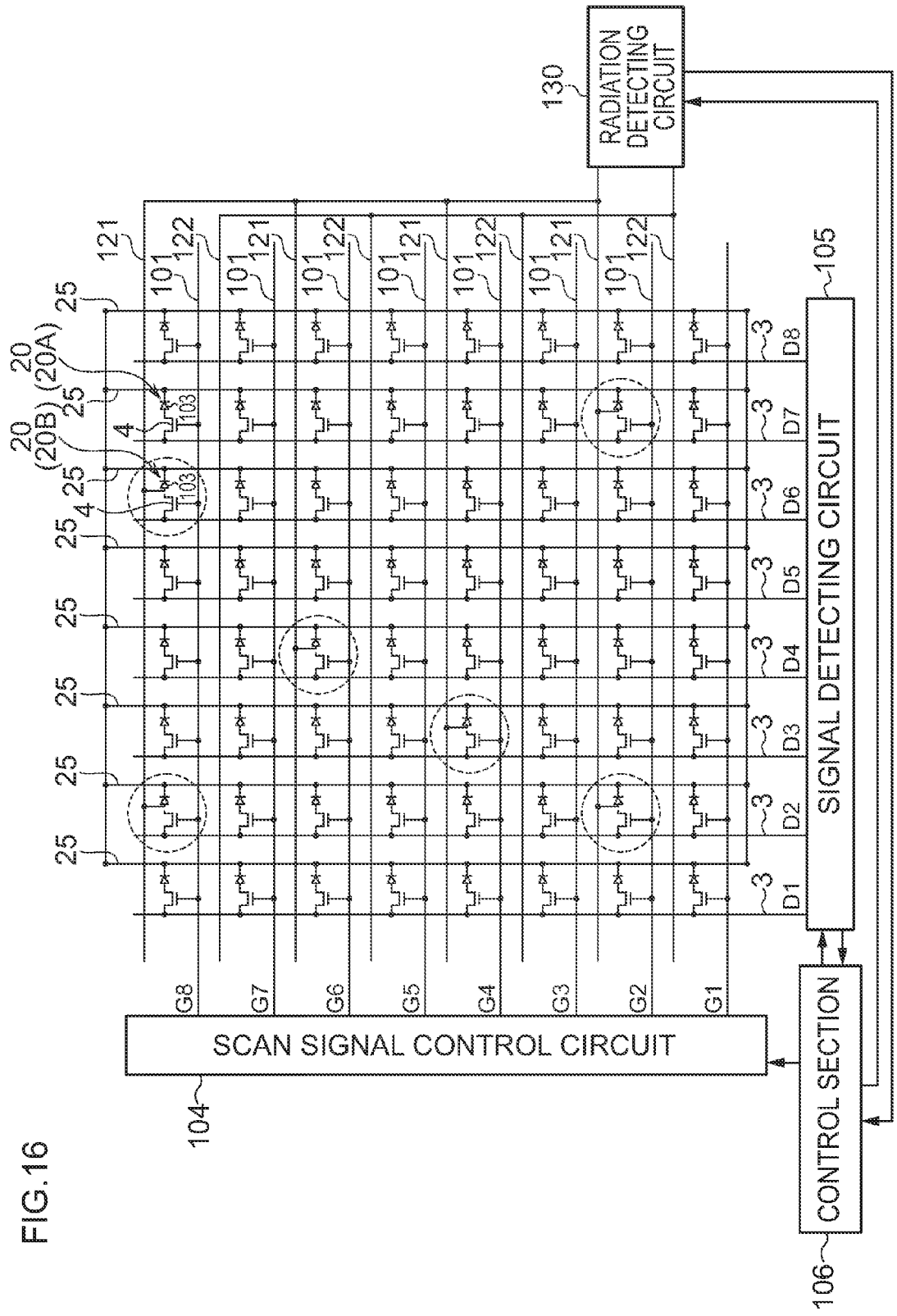
FIG. 16 is a drawing showing the overall configuration of a radiographic imaging device relating to a third exemplary embodiment.

The overall configuration of the radiographic imaging device 100 that uses the radiation detecting element 10 relating to the third exemplary embodiment is shown in FIG. 16. Note that portions that are the same as in the above-described first exemplary embodiment (see FIG. 1) are denoted by the same reference numerals, and description thereof is omitted.

In the radiation detecting element 10 relating to the third exemplary embodiment, lines 121 for radiation detection are provided in parallel to the scan lines 101 at the lines of pixels in one direction (the lateral direction in FIG. 16, hereinafter also called "row direction") at which the radiation detection pixels 20B are provided. Further, lines 122 for noise detection are provided at the lines of pixels that are adjacent to the respective lines of pixels in the row direction at which the lines 121 for radiation detection are provided.

Among the plural pixels 20, at the radiographic imaging pixels 20A, the sensor portions 103 are connected to the signal lines 3 via the TFT switches 4, and, at the radiation detection pixels 20B, the sensor portions 103 are disconnected from the TFT switches 4, and these sensor portions 103 are connected to the lines 121 for radiation detection. Due thereto, electric signals, that correspond to the charges that are generated in the respective sensor portions 103 of the respective pixels 20B for radiation detection, flow to the lines 121 for radiation detection.

The radiographic imaging device 100 relating to the present exemplary embodiment has a radiation detecting circuit 130.

Ones of ends of the respective lines 121 for radiation detection that are provided at the radiation detecting element 10 are connected in parallel, and these one ends are connected to the radiation detecting circuit 130. Ones of ends of the respective lines 122 for noise detection as well are connected in parallel, and these one ends are connected to the radiation detecting circuit 130.

The radiation detecting circuit 130 incorporates an amplification circuit therein, and is connected to the control section 106. The radiation detecting circuit 130 operates in accordance with control from the control section 106. The radiation detecting circuit 130 amplifies, by the amplification circuit, the electric signals that flow through the lines 121 for radiation detection and the lines 122 for noise detection that are connected thereto, and thereafter, converts the respective amplified signals into digital data, and outputs the converted digital data to the control section 106.

Figure 17:
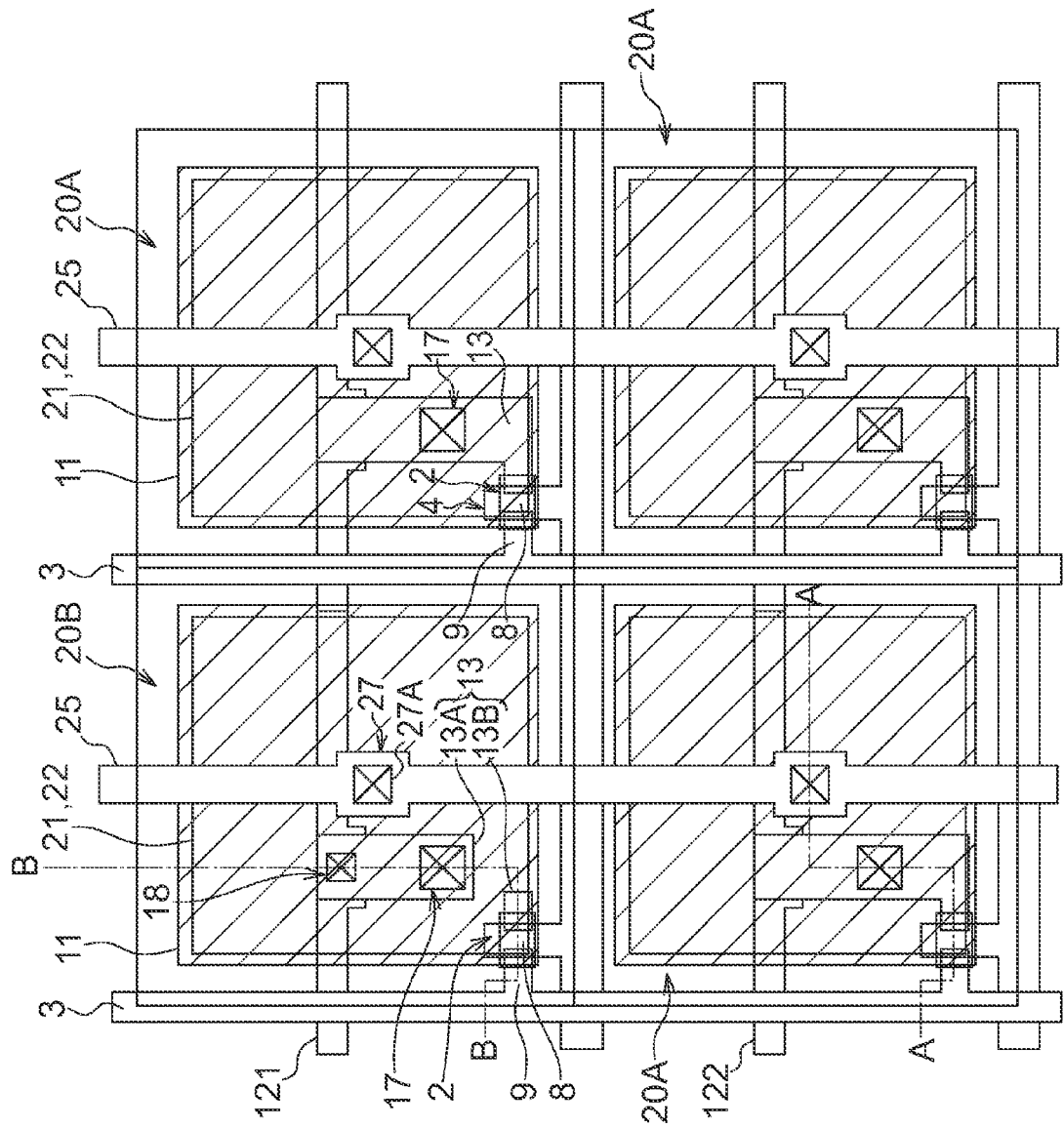
FIG. 17 is a plan view showing the configuration of a radiation detecting element relating to the third exemplary embodiment.
Figure 18:
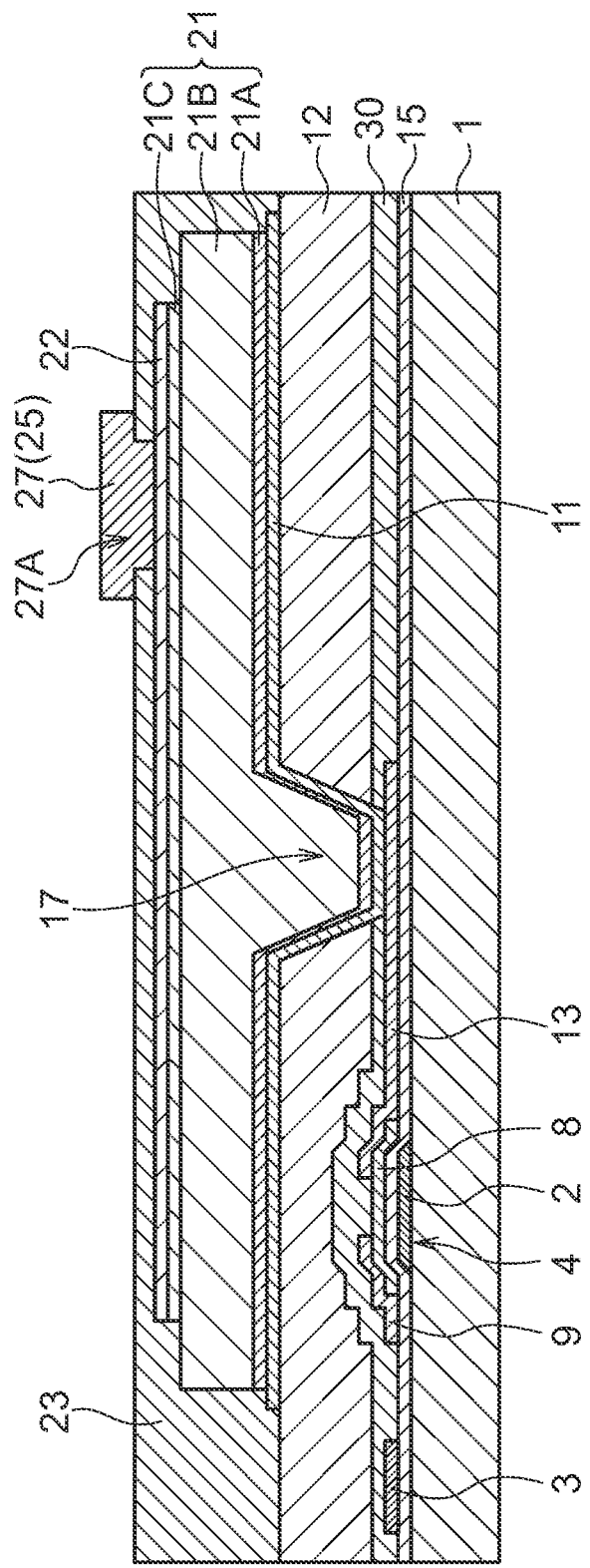
FIG. 18 is a line sectional view of the radiation detecting element relating to the third exemplary embodiment.
Figure 19:
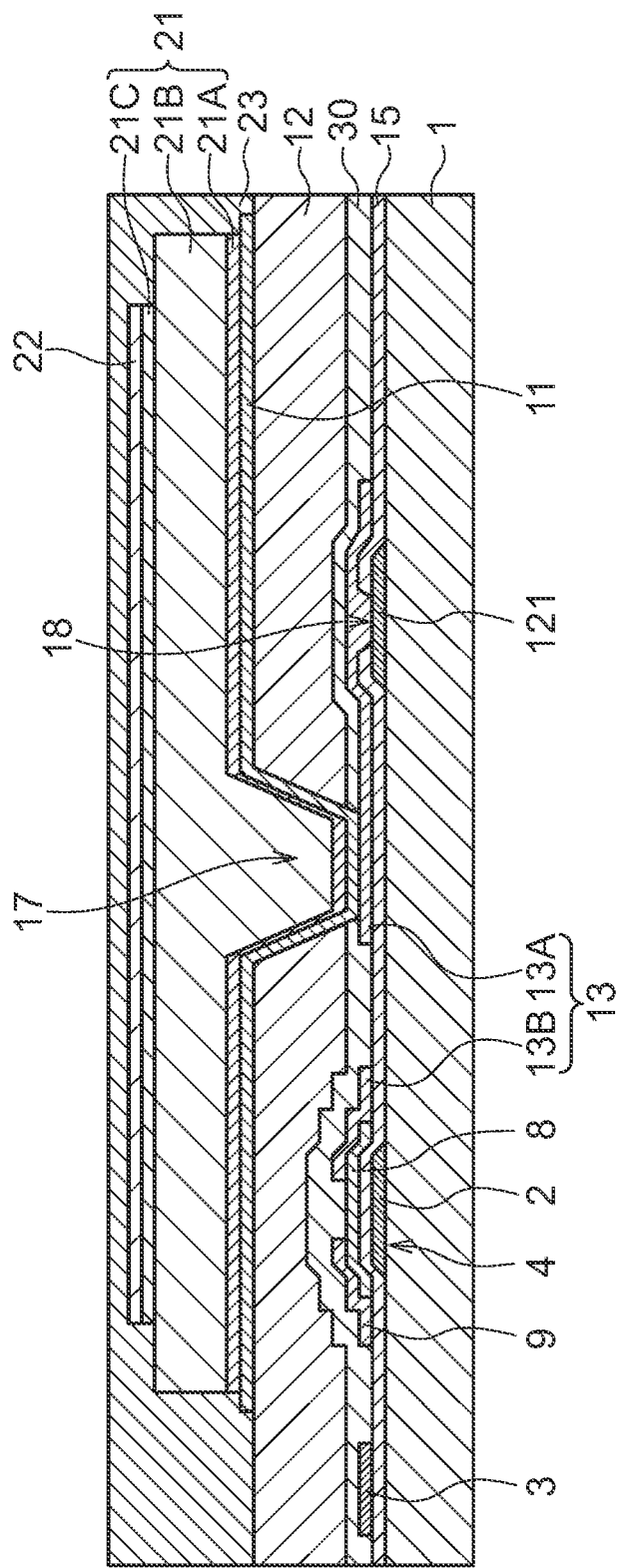
FIG. 19 is a line sectional view of the radiation detecting element relating to the third exemplary embodiment.

A plan view showing the configurations of four pixels that are three of the radiographic imaging pixels 20A and one of the radiation detection pixels 20B of the indirect-conversion-type radiation detecting element 10 relating to the third exemplary embodiment, is shown in FIG. 17. A line A-A sectional view of the radiographic imaging pixel 20A of FIG. 17 is shown in FIG. 18. A line B-B sectional view of the radiation detection pixel 20B of FIG. 17 is shown in FIG. 19. Note that portions that are the same as those of the above-described first exemplary embodiment (see FIG. 2 through FIG. 4) are denoted by the same reference numerals, and description thereof is omitted.

As shown in FIG. 18 and FIG. 19, at the pixels 20A and the radiation detection pixels 20B of the radiation detecting element 10, the first scan lines 101 (see FIG. 17) and the gate electrodes 2 are formed on the insulating substrate 1 as the first signal wiring layer, and the scan lines 101 and the gate electrodes 2 are connected (see FIG. 17). Further, at the lines of pixels at which the radiation detection pixels 20B are formed, the lines 121 for radiation detection are formed parallel to the scan lines 101 also as the first signal wiring layer. At the lines of pixels that are adjacent to the lines of pixels at which the lines 121 for radiation detection are formed, the lines 122 for noise detection are formed also as the first signal wiring layer.

The insulating film 15 is formed on the entire surface on the first signal wiring layer. The semiconductor active layers 8 are formed in the shapes of islands on the insulating film 15. At the layer above these, the source electrodes 9 and the drain electrodes 13 are formed as the second signal wiring layer.

At the radiation detection pixels 20B of the radiation detecting element relating to the present exemplary embodiment, contact holes 18 are formed at positions of the insulating film 15 that oppose the drain electrodes 13 and the lines 121 for radiation detection, and the drain electrodes 13 are formed so as to fill-in the contact holes 18 that are formed in the insulating film 15. Further, the drain electrode 13 is formed so as to be divided into two electrodes 13A, 13B. The electrode 13A, that is formed so as to fill-in the contact hole 18, is connected to the lower electrode 11 of the sensor portion 103 via the contact hole 17. Namely, the line 121 for radiation detection is electrically connected to the lower electrode 11 via the electrode 13A. Because the line 121 for radiation detection is connected to the lower electrode 11 without going through the TFT switch 4 in this way, the charges of the sensor portion 103 can be read-out directly.

Respective layers are formed on the second signal wiring layer, in the same way as in the first exemplary embodiment (see FIG. 2 through FIG. 4).

Figure 20:
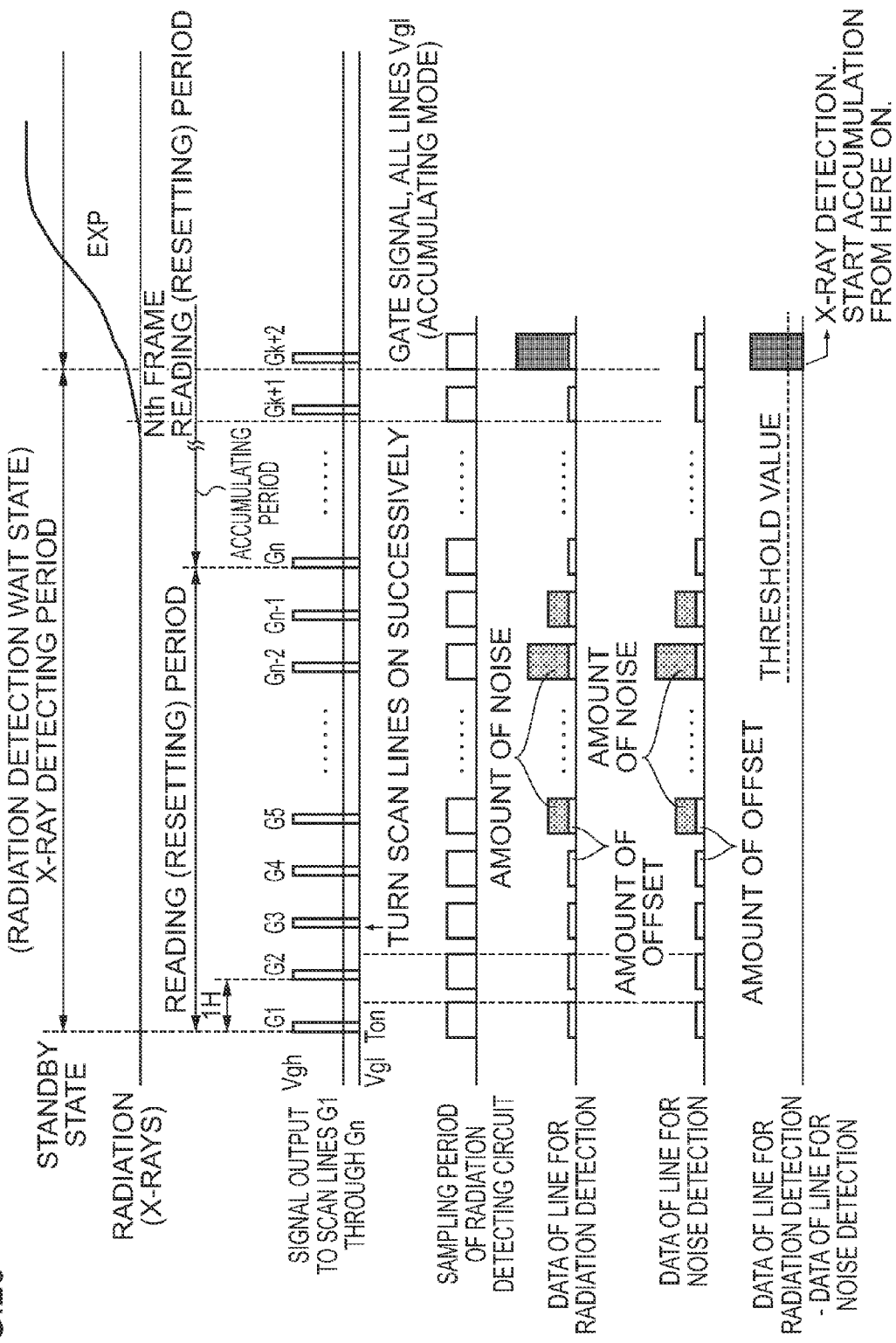
FIG. 20 is a time chart showing in detail the flow of operations at the time of imaging a radiographic image of the radiographic imaging device relating to the third exemplary embodiment.

A timing chart showing the flow of operations when a radiographic image is captured by the radiographic imaging device 100 relating to the present exemplary embodiment is shown in FIG. 20.

As described above, if the wait period for detecting radiation is long, charges are accumulated in the respective pixels 20 due to dark current or the like. Thus, in the case of the radiation detection wait state, the control section 106 controls the scan signal control circuits 104 such that a resetting operation is carried out in which ON signals are outputted from the scan signal control circuits 104 to the respective first scan lines 101 in order and line-by-line, and the respective TFT switches 4 connected to the respective first scan lines 101 are turned ON in order and line-by-line, and the charges accumulated in the respective pixels 20 of the radiation detecting element 10 are extracted.

Further, the control section 106 controls the radiation detecting circuit 130 such that sampling, in which electric signals that flow through the lines 121 for radiation detection and the lines 122 for noise detection are respectively converted into digital data, and detection of radiation is carried out, is repeated at the predetermined period 1H. The radiation detecting circuit 130 outputs, to the control section 106, the converted digital data of the lines 121 for radiation detection and the lines 122 for noise detection.

Here, the radiation detection pixels 20B are connected to the lines 121 for radiation detection, and the radiation detection pixels 20B are not connected to the lines 122 for noise detection. Therefore, when radiation is irradiated, at the lines 121 for radiation detection, electric signals are generated due to radiation being irradiated, whereas, at the lines 122 for noise detection, electric signals are not generated due to radiation being irradiated. Further, similar noise is generated at the lines 121 for radiation detection and the lines 122 for noise detection due to external disturbance.

At the control section 106, the value of the digital data of the line 122 for noise detection that was inputted from the radiation detecting circuit 130 is subtracted from the value of the digital data of the line 121 for radiation detection that was inputted from the radiation detecting circuit 130. The digital data value that is the resulting difference is compared with a predetermined threshold value for radiation sensing. In accordance with whether or not this digital data value is greater than or equal to the threshold value, it is detected whether or not radiation is irradiated.

Due thereto, even when noise arises at the line 121 for radiation detection and the line 122 for noise detection due to external disturbance, the electric signals that flow through the line 121 for radiation detection and the line 122 for noise detection are converted into digital data, and, by subtracting the value of the converted digital data of the line 122 for noise detection from the value of the converted digital data of the line 121 for radiation detection, a value corresponding to the amount of noise is cancelled.

In this way, in accordance with the present exemplary embodiment, even when noise arises due to an external disturbance or the like, the effects of noise are suppressed and radiation can be detected accurately. Due thereto, even when noise arises at the respective signal lines 3, there is no need to set the threshold value for radiation sensing to be high in consideration of the amount of noise. Therefore, the start of irradiation of the radiation may be detected earlier.

Further, in accordance with the present exemplary embodiment, at the radiation detection pixels 20B, the electric signals flow-out to the lines 121 for radiation detection regardless of the switched states of the TFT switches 4. Therefore, even during the off period in which off signals are being outputted to the respective scan lines 101 from the scan signal control circuits 104, detection of radiation by sampling at the radiation detecting circuit 130 may be possible.

[Fourth Exemplary Embodiment]

A fourth exemplary embodiment is described next.

Figure 21:
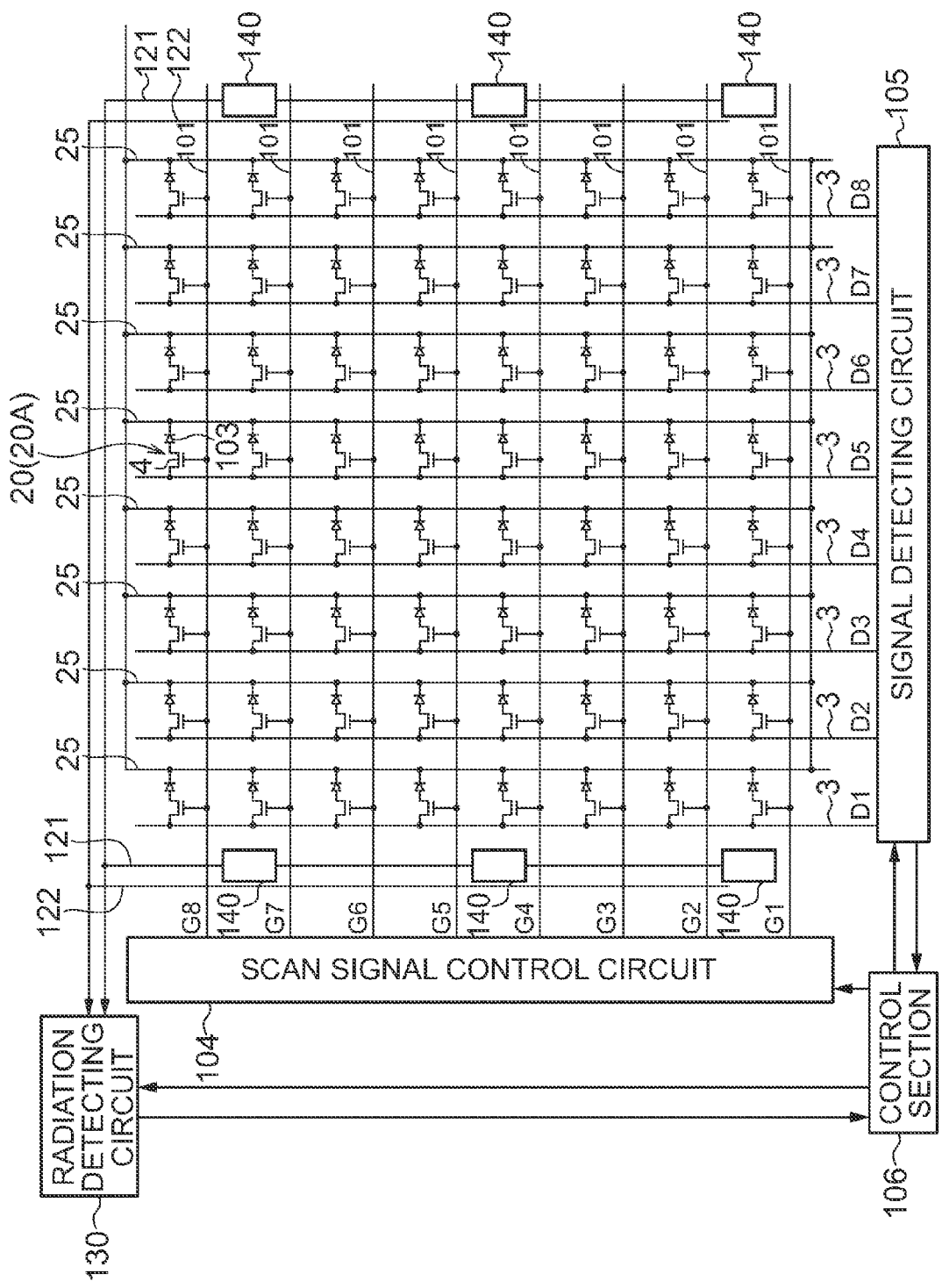
FIG. 21 is a drawing showing the overall configuration of a radiographic imaging device relating to a fourth exemplary embodiment.

The overall configuration of the radiographic imaging device 100 that uses the radiation detecting element 10 relating to the fourth exemplary embodiment is shown in FIG. 21. Note that portions that are the same as in the above-described first exemplary embodiment (see FIG. 1) are denoted by the same reference numerals, and description thereof is omitted.

In the radiation detecting element 10 relating to the fourth exemplary embodiment, all of the pixels 20 are the radiographic imaging pixels 20A, and plural sensor portions 140 for radiation detection, that receive radiation and generate charges, are provided at the periphery of the imaging region at which the pixels 20 are disposed in the form of a matrix. Note that, when a scintillator is formed above the sensor portions 140, the sensor portions 140 may be configurations that receive light from the scintillator and generate charges.

Further, at the radiation detecting element 10 relating to the fourth exemplary embodiment, the lines 121 for radiation detection and the lines 122 for noise detection are provided in parallel along substantially the same paths, at the periphery of the imaging region. The respective sensor portions 140 are connected to the lines 121 for radiation detection.

In the same way as in the third exemplary embodiment, the radiographic imaging device 100 relating to the fourth exemplary embodiment has the radiation detecting circuit 130.

The lines 121 for radiation detection and the lines 122 for noise detection are respectively connected to the radiation detecting circuit 130.

The radiation detecting circuit 130 incorporates an amplification circuit therein, and is connected to the control section 106. The radiation detecting circuit 130 operates in accordance with control from the control section 106. The radiation detecting circuit 130 amplifies, by the amplification circuit, the respective electric signals that flow through the lines 121 for radiation detection and the lines 122 for noise detection that are connected thereto, and thereafter, converts the amplified signals into digital data, and outputs the converted digital data to the control section 106.

When the control section 106 is notified of the shift to the imaging mode, the control section 106 shifts to a radiation detection wait state and controls the radiation detecting circuit 130 such that sampling, in which the electric signals that flow through the lines 121 for radiation detection and the lines 122 for noise detection are respectively converted into digital data, and detection of radiation is carried out, is repeated at the predetermined period 1H. The radiation detecting circuit 130 outputs the converted digital data of the lines 121 for radiation detection and the lines 122 for noise detection to the control section 106.

Here, although the sensor portions 140 are connected to the lines 121 for radiation detection, the sensor portions 140 are not connected to the lines 122 for noise detection. Therefore, when radiation is irradiated, at the lines 121 for radiation detection, electric signals are generated due to radiation being irradiated, whereas, at the lines 122 for noise detection, electric signals are not generated due to radiation being irradiated. Moreover, similar noise is generated at the lines 121 for radiation detection and the lines 122 for noise detection due to external disturbance.

Note that the line capacity of the lines 122 for noise detection is interpolated as being smaller, by an amount corresponding to the sensor portions 140, than that of the lines 121 for radiation detection. Therefore, dummy capacitors maybe disposed at the lines 122 for noise detection at positions adjacent to the sensor portions 140. At the dummy capacitor, for example, by placing a light-blocking film on the upper electrode of a photodiode that has the same layer configuration and the same shape as the sensor portion, the dummy capacitor can be configured such that the capacity thereof is the same as the sensor portion but the sensitivity with respect to radiation is substantially zero.

At the control section 106, the value of the digital data of the line 122 for noise detection that was inputted from the radiation detecting circuit 130 is subtracted from the value of the digital data of the line 121 for radiation detection that was inputted from the radiation detecting circuit 130. The digital data value that is the resulting difference is compared with a predetermined threshold value for radiation sensing. In accordance with whether or not this digital data value is greater than or equal to the threshold value, it is detected whether or not radiation is irradiated.

Due thereto, even when noise arises at the line 121 for radiation detection and the line 122 for noise detection due to external disturbance, the electric signals that flow through the line 121 for radiation detection and the line 122 for noise detection are converted into digital data, and, by subtracting the value of the converted digital data of the line 122 for noise detection from the value of the converted digital data of the line 121 for radiation detection, a value corresponding to the amount of noise is cancelled.

In this way, in accordance with the present exemplary embodiment, even when noise arises due to an external disturbance or the like, the effects of noise are suppressed and radiation can be detected accurately. Due thereto, even when noise arises at the respective signal lines 3, there is no need to set the threshold value for radiation sensing to be high in consideration of the amount of noise. Therefore, the start of irradiation of the radiation may be detected earlier.

Note that the above first exemplary embodiment describes a case in which, at the radiation detection pixels 20B, the TFT switch 4 is formed by short-circuiting the source and the drain. However, for example, the sensor portion 103 may be directly connected to the signal line 3, without forming the TFT switch 4.

Figure 22:
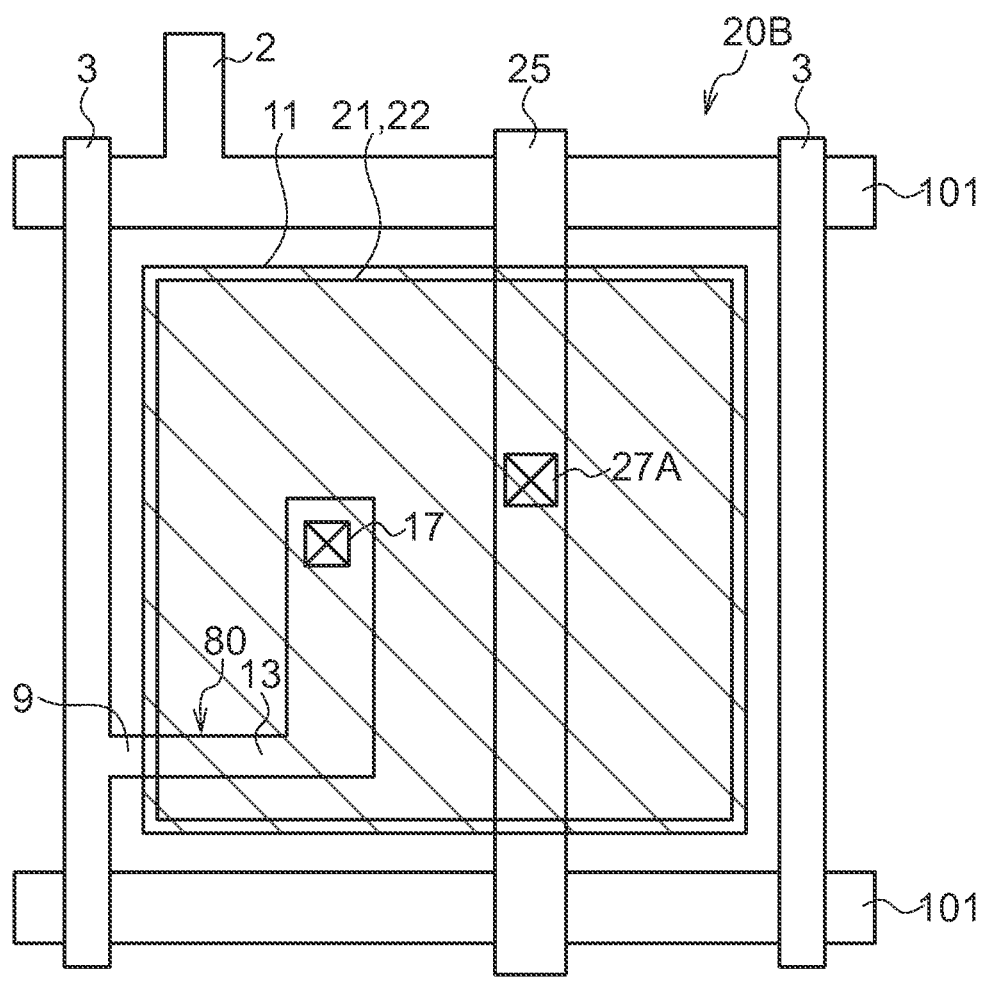
FIG. 22 is a plan view showing the configuration of a radiation detecting element relating to an alternative exemplary embodiment.
Figure 23:
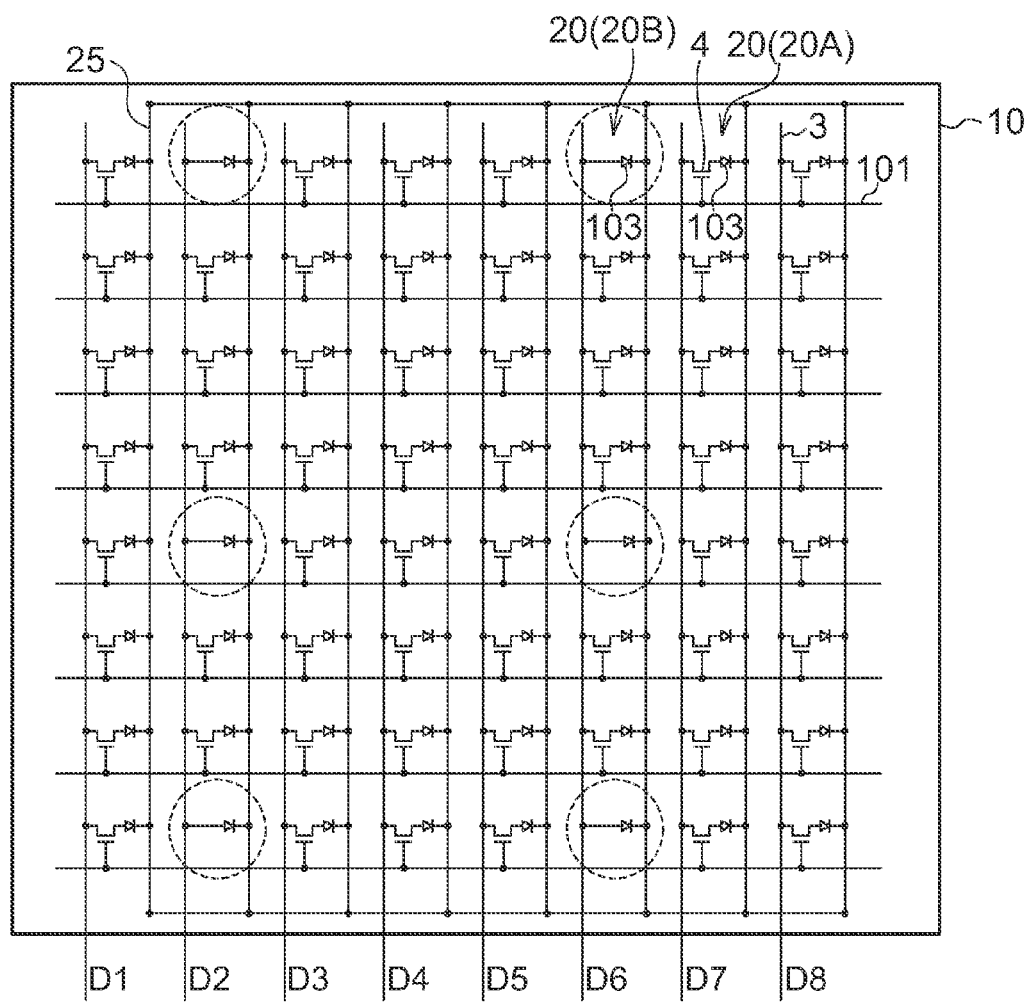
FIG. 23 is a drawing showing the overall configuration of a radiation detecting element relating to an alternative exemplary embodiment.

For example, as shown in FIG. 22, at the radiation detection pixel 20B, a connecting line 80 may be formed that connects the source electrode 9 and the drain electrode 13, and electrically connects the lower electrode 11 of the sensor portion 103 and the signal line 3, without providing the gate electrode 2 and the semiconductor active layer 8. In such a case, as shown in FIG. 23, at the radiographic imaging pixels 20A, the sensor portion 103 is electrically connected to the signal line 3 via the TFT switch 4, but, at the radiation detection pixels 20B, the TFT switch 4 is not provided, and the sensor portion 103 is electrically connected to the signal line 3 directly.

Figure 24:
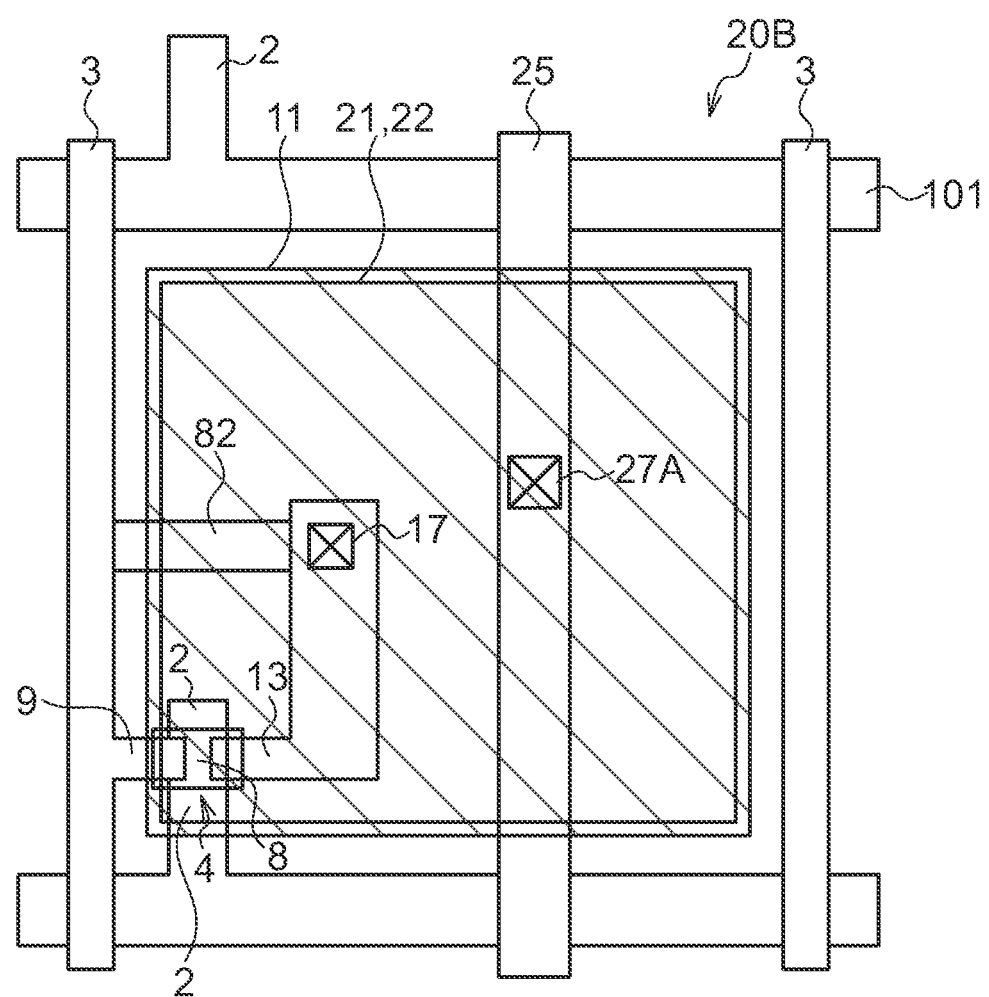
FIG. 24 is a plan view showing the configuration of a radiation detecting element relating to an alternative exemplary embodiment.
Figure 25:
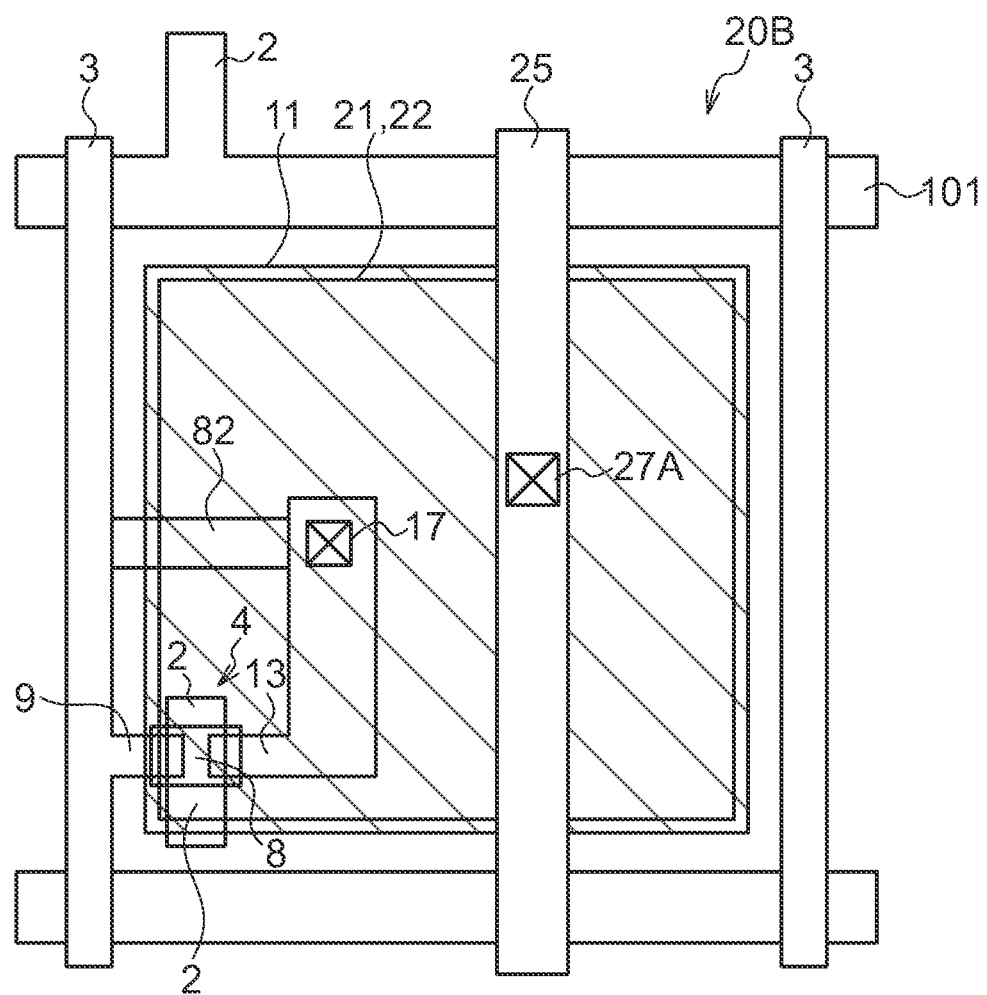
FIG. 25 is a plan view showing the configuration of a radiation detecting element relating to an alternative exemplary embodiment.

Further, the above first exemplary embodiment describes a case in which, at the radiation detection pixels 20B, the TFT switch 4 is formed by short-circuiting the source and the drain. However, for example, as shown in FIG. 24, a connecting line 82 may be formed from along the drain electrode 13, and this connecting line 82 may be connected to the signal line 3. In this case as well, the source and the drain of the TFT switch 4 are substantially short-circuited. When the source and the drain of the TFT switch 4 are short-circuited such as in the first exemplary embodiment or as shown in FIG. 24, the gate electrode 2 may be formed so as to be apart from the scan line 101 as shown in FIG. 25.

Figure 29:
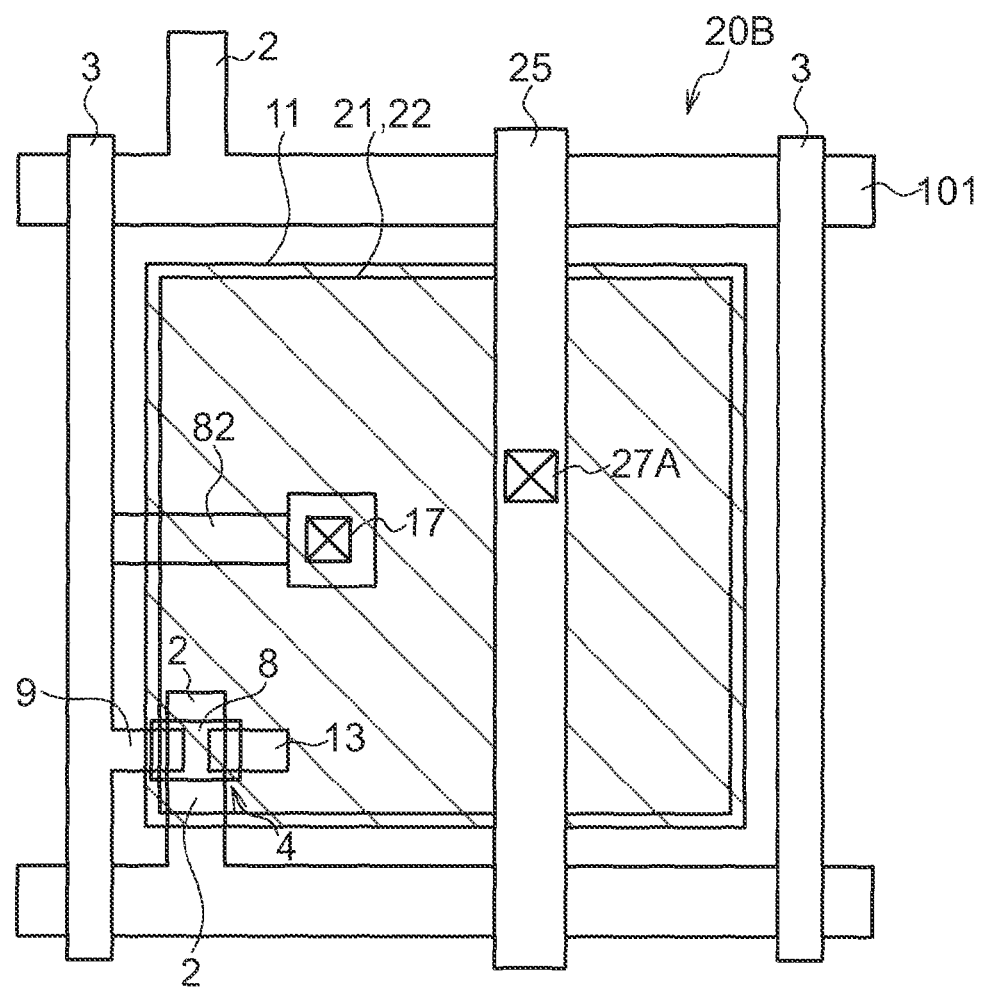
FIG. 29 is a plan view showing the configuration of a radiation detecting element relating to an alternative exemplary embodiment.

Moreover, for example, as shown in FIG. 29, at the radiation detection pixels 20B, the connecting line 82 may be formed, and the sensor portion 103 and the signal line 3 may be connected via the connecting line 82 and the contact hole 17, and the drain electrode 13 and the contact hole 17 may be electrically disconnected.

At the radiation detection pixels 20B, when the source electrode 9 and the drain electrode 13 of the TFT switch 4 are short-circuited as shown in FIG. 2 and FIG. 4, a capacity Cgd between the gate electrode 2 and the drain electrode 13 is greater than that at the usual pixels 20A for radiographic imaging. Due thereto, at the radiation detecting element 10, a difference arises in the offset charge amounts from the difference in the line capacities of the signal lines 3, to which the radiation detection pixels 20B are connected, and the other signal lines 3, to which the radiation detection pixels 20B are not connected.

On the other hand, at the radiation detection pixels 20B, when the source electrode 9 and the drain electrode 13 are connected without providing the gate electrode 2 and the semiconductor active layer 8 as shown in FIG. 22, because there is no TFT switch 4, the capacity Cgd is zero. However, at the radiation detecting element 10, the difference in the line capacities of the signal lines 3, to which the radiation detection pixels 20B are connected, and the other signal lines 3, to which the radiation detection pixels 20B are not connected, is large, and a difference arises in the feed-through voltages of the signal lines 3, to which the radiation detection pixels 20B are connected, and the other signal lines 3, to which the radiation detection pixels 20B are not connected, and a difference arises in the offset charge amounts.

In contrast, at the radiation detection pixels 20B, when the connecting line 82 is formed from along the drain electrode 13 and connects the sensor portion 103 and the signal line 3 as shown in FIG. 24, the difference in the line capacities of the signal lines 3, to which the radiation detection pixels 20B are connected, and the other signal lines 3, to which the radiation detection pixels 20B are not connected, can be made to be small. Further, at the radiation detection pixels 20B, when the connecting line 82 is formed and connects the sensor portion 103 and the signal line 3, and the drain electrode 13 and the contact hole 17 are electrically disconnected as shown in FIG. 29, the difference in the line capacities of the signal lines 3, to which the radiation detection pixels 20B are connected, and the other signal lines 3, to which the radiation detection pixels 20B are not connected, can be made to be even smaller.

Here, concrete comparison is carried out with respect to the feed-through charges and the line capacities of: the radiographic imaging pixels 20A; the radiation detection pixels 20B (hereinafter called radiation detection pixels 20B-1) at which the source electrode 9 and the drain electrode 13 of the TFT switch 4 are short-circuited, as shown in FIG. 2 and FIG. 4; the radiation detection pixels 20B (hereinafter called radiation detection pixels 20B-2) at which the source electrode 9 and the drain electrode 13 are connected without providing the gate electrode 2 and the semiconductor active layer 8, as shown in FIG. 22; the radiation detection pixels 20B (hereinafter called pixels radiation detection 20B-3) at which the connecting line 82 is formed from along the drain electrode 13 and connects the sensor portion 103 and the signal line 3, as shown in FIG. 24; and the radiation detection pixels 20B (hereinafter called pixels 20B-4) at which the connecting line 82 is formed and connects the sensor portion 103 and the signal line 3, and the drain electrode 13 and the contact hole 17 are electrically disconnected, as shown in FIG. 29.

Given that:

Cgd: capacity between the gate electrode 2 and the drain electrode 13,

Vpp: VgH (voltage of control signal that turns the TFT switch 4 on)–Vgl (voltage of control signal that turns the TFT switch 4 off), Ca—Si: capacity of channel portion of the TFT switch 4, Cgs: capacity between the gate electrode 2 and the source electrode 9, Ctft: amount of contribution to capacity of the scan line 101 per one TFT switch 4, Cpd: capacity of the sensor portion 103, and Csd: capacity between the lower electrode 11 and the signal lines 3 at both sides of the pixel 20 that includes that lower electrode 11, feed-through charges ΔQ of the pixels 20A and the radiation detection pixels 20B-1 through 20B-4 are as follows.

pixels 20A: $\Delta Q = Cgd \times Vpp$ (1)

pixels 20B-1: $\Delta Q = (Cgd + Ca\text{—}Si + Cgs) \times Vpp 4 Cgd \times Vpp$ (2)

pixels 20B-2: $\Delta Q = 0$ (3)

pixels 20B-3: $\Delta Q = (Cgd + Cgs) \times Vpp = 2 Cgd \times Vpp$ (4)

pixels 20B-4: $\Delta Q = Cgd \times Vpp$ (5)

Accordingly, the radiation detection pixels 20B-4, at which the feed-through charge ΔQ is near to that of the pixels 20A, are preferable. Further, the radiation detection pixels 20B-3 as well are more preferable that the radiation detection pixels 20B-1.

On the other hand, the amount of contribution Ctft to the capacity of the scan line 101 per one TFT switch 4 of the pixels 20A and the radiation detection pixels 20B-1 through 20B-4 are as follows.

pixels 20A: $Ctft = Cgd + Cgs // (Cpd + Csd)$ $= Cgd + \{Cgs(Cpd + Csd)/(Cgs + Cpd + Csd)\}$ Here, (Cpd≧Cgs) and (Cpd≧Csd), and therefore, Cgs and Csd can be ignored, and therefore $Cgd + Cgs 2 Cgd$ (6)

pixels 20B-1: $Ctft = Cgd + Ca\text{—}Si + Cgs 4 Cgd$ (7)

pixels 20B-2: $Ctft = 0$ (8)

pixels 20B-3: $Ctft = Cgd + Cgs 2 Cgd$ (9)

pixels 20B-4: $Ctft = Cgd$ (10)

Accordingly, when attempting to keep the variation in the line capacities small, the radiation detection pixels 20B-3, whose capacity Ctft is near to that of the pixels 20A, are preferable.

Because feed-through charges greatly affect image quality, by using the configuration of the radiation detection pixels 20B-4, the feed-through component can be brought into line with that of the other pixels. Due thereto, the phenomenon of the offset value fluctuating at the radiation detection pixels 20B for radiation sensing can be suppressed. Moreover, even the configuration of the radiation detection pixels 20B-3 is effective because the feed-through may be cut in half as compared with the radiation detection pixels 20B-1.

Figure 26:
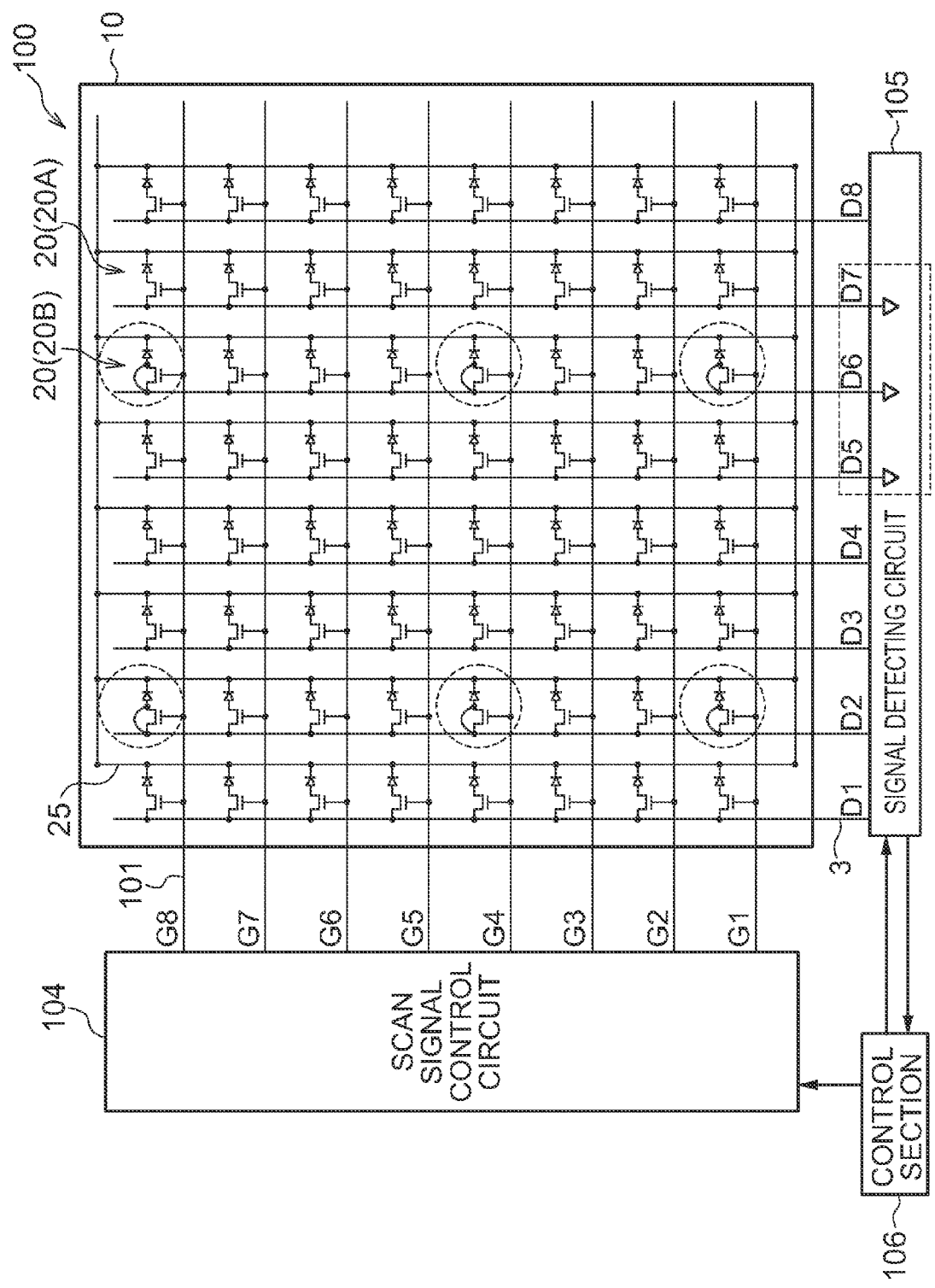
FIG. 26 is a drawing showing the overall configuration of a radiation detecting element relating to an alternative exemplary embodiment.

The above first and second exemplary embodiments describe cases in which noise is cancelled by carrying out, at the predetermined period 1H, sampling of the electric signals that flow to the D6 signal line 3 to which the radiation detection pixels 20B are connected and to the D7 signal line 3, that is disposed adjacent to the D6 signal line 3 and to which the radiation detection pixels 20B are not connected, and by subtracting the value of the digital data of the D7 signal line 3 from the value of the digital data of the D6 signal line 3. However, the present invention is not limited thereto. For example, as shown in FIG. 26, sampling of the electric signals that flow to the D5 and D7 signal lines 3, that are disposed adjacent to the D6 signal line 3 at either side thereof, may be carried out, and the average value of the values of the digital data of the D5 and D7 signal lines 3 may be determined, and this average value may be subtracted from the value of the digital data of the D6 signal line 3 to which the radiation detection pixels 20B are connected. Namely, the electric signals that flow to plural signal lines 3 to which the radiation detection pixels 20B are not connected may be detected, and the respective digital data may be determined, and the average value of the values of the determined digital data may be determined, and that average value may be subtracted from the value of the digital data of the D2 signal line 3 to which the radiation detection pixels 20B are connected. In this case as well, for the signal lines 3 at which sampling is carried out together with the signal line 3 to which the radiation detection pixels 20B are connected, if the noise that is generated at the respective signal lines 3 is similar, any of the signal lines 3 may be used provided that the radiation detection pixels 20B are not connected thereto. However, if there is non-uniformity in the noise that is generated due to the positions of the signal lines 3 within the radiation detecting element 10, it is preferable that the signal lines 3, on which sampling is carried out together with the signal line 3 to which the radiation detection pixels 20B are connected, be near to the signal line 3 that is the object of sampling and to which the radiation detection pixels 20B are connected, and be connected to the same signal detecting circuit 105 as that signal line 3.

Further, the above exemplary embodiments describe a method of making a judgment after determining the difference in the values of the digital data. However, the data of the signal line 3 (first line) to which the radiation detection pixels 20B are connected and the signal line 3 (second line) to which the radiation detection pixels 20B are not connected may be judged respectively. (It suffices to, in the end, obtain a detection accuracy improving effect that is the same as that of the difference processing by using the second line). For example, when the signal value of the second line is less than or equal to a given value, it is judged that there is no external disturbance noise, and by using the signal value of the first line as is in sensing the radiation amount, the subtraction processing is not carried out.

Moreover, the second exemplary embodiment describes a case in which the second scan lines 108 are provided in parallel to the first scan lines 101 at each of the lines of pixels in the row direction at which the radiation detection pixels 20B are provided, as shown in FIG. 11. However, the present invention is not limited thereto. For example, the second scan lines 108 may be provided in parallel to the first scan lines 101 at all of the lines of pixels in the row direction, and the TFT switches 4 of the radiation detection pixels 20B may be connected to the second scan lines 108. Due thereto, the wiring patterns of the first scan lines 101, the second scan lines 108, and the signal lines 3 may be made to be the same.

Further, the above second exemplary embodiment describes a case in which, as shown in FIG. 11, control signals that turn the TFT switches 4 on are outputted at a single time to all of the second scan lines 108 from the control signal outputting circuit 120 to which the one ends of the second scan lines 108 are connected in parallel. However, the present invention is not limited thereto. For example, the respective second scan lines 108 may respectively be individually connected to the control signal outputting circuit 120, and control signals that turn the TFT switches 4 on may be outputted individually to the respective second scan lines 108 from the control signal outputting circuit 120. Due thereto, a region can be selected, and detection of radiation can be carried out with respect thereto.

The above exemplary embodiments describe cases in which the signal line 3 (e.g., D6) to which the radiation detection pixels 20B are connected is the first line, the signal line 3 (e.g., D7) to which the radiation detection pixels 20B are not connected is the second line, and the difference between the electric signal flowing through the first line and the electric signal flowing through the second line is determined. However, the present invention is not limited thereto. If suffices to concentratedly dispose the plural pixels 20B on the specific signal line 3 that is used as the first line. The radiation detection pixels 20B may also be connected to the signal line 3 that is used as the second line, provided that the number of the radiation detection pixels 20B connected thereto is less than the number of the radiation detection pixels 20B connected to the first line. For example, the radiation detection pixels 20B, of a number that is less than that of the D6 signal line 3, may be connected also to the D7 signal line 3 in FIG. 6, FIG. 11 and FIG. 26.

Further, although the above exemplary embodiments describe cases in which the radiographic imaging pixels 20A and the radiation detection pixels 20B are provided as the pixels 20 of the radiation detecting element 10, for example, pixels directed toward other applications may be provided.

Although the above exemplary embodiments describe cases of detecting the start of irradiation of radiation, the present invention is not limited thereto. For example, during irradiation of radiation as well, sampling, in which the electric signals of the signal line 3 to which the radiation detection pixels 20B are connected and the signal line 3 to which the radiation detection pixels 20B are not connected are converted into digital data and detection of radiation is carried out, may be repeated at the predetermined period 1H, and the value of the digital data, that is obtained by subtracting the value of the digital data of the signal line 3 to which the radiation detection pixels 20B are not connected from the value of the digital data of the signal line 3 to which the radiation detection pixels 20B are connected, may be compared with a predetermined threshold value for radiation sensing, and detection of the end of irradiation of the radiation may be carried out in accordance with whether or not that value is less than the threshold value. Moreover, the digital data value obtained by subtraction may be accumulated, and the cumulative irradiated amount of the radiation may be detected. By making it possible to detect the cumulative irradiated amount of radiation in this way, the radiation detection pixels 20B can be used as sensors for detecting the irradiated amount of radiation (AEC).

Figure 27:
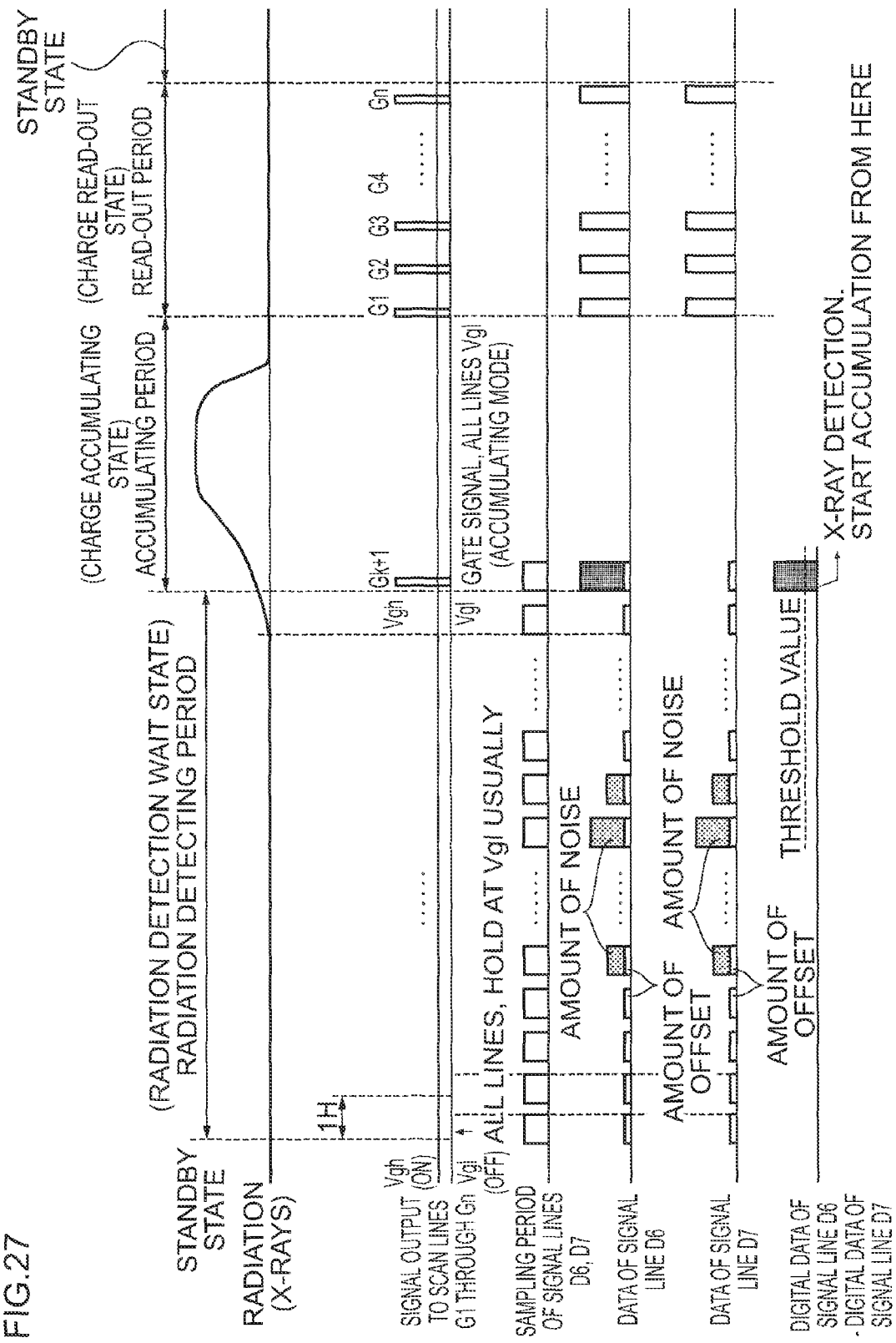
FIG. 27 is a time chart showing in detail the flow of operations at the time of imaging a radiographic image of a radiographic imaging device relating to an alternative exemplary embodiment.

Further, the above exemplary embodiments describe cases in which a resetting operation, that is the same as that in the standby state, is carried out also during the radiation detection wait state. However, the present invention is not limited thereto. For example, as shown in FIG. 27, the resetting operation may be stopped during the radiation detection wait state. Further, a resetting operation may be carried out in which on signals are outputted simultaneously to all of the scan lines 101 at a predetermined period, and the charges respectively accumulated in all of the pixels 20 of the radiation detecting element 10 are taken-out.

Although the above first through third exemplary embodiments describe cases in which the radiation detection pixels 20B are disposed so as to be scattered, the present invention is not limited thereto. For example, the plural pixels 20B may be concentratedly disposed respectively at specific ranges. For example, when carrying out detection of the start of irradiation or the end of irradiation of radiation by the radiation detection pixels 20B, the specific range is preferably in the neighborhood of the region in which the subject is mainly disposed. When carrying out detection of the irradiated amount of radiation by the radiation detection pixels 20B, the specific range is preferably the region at which the subject is mainly disposed. In general imaging, the central portion of the detection region is the region where the subject is mainly disposed. In mammography, one end portion of the detection region toward the side of the patient is the region where the subject is mainly disposed. Note that, in order to carry out interpolation processing that interpolates the image information of the radiation detection pixels 20B at the control section 106, it is preferable that the radiation detection pixels 20B not be adjacent to one another, and, for example, the radiation detection pixels 20B may be disposed diagonally with respect to one another.

Figure 28:
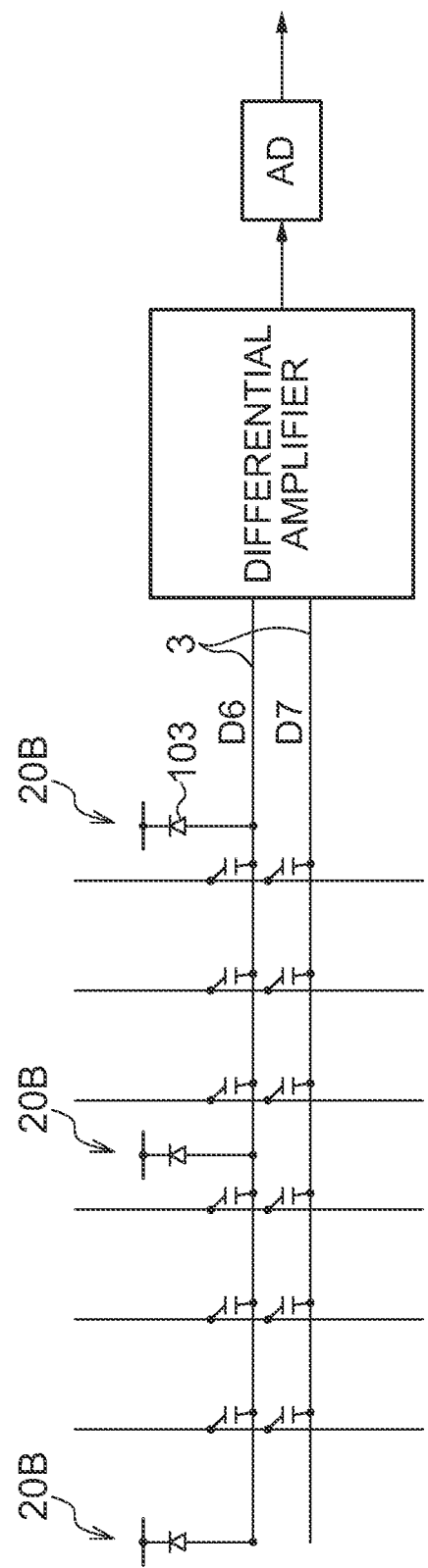
FIG. 28 is an equivalent circuit diagram that focuses on the D6 and D7 signal lines 3 of a radiation detecting element relating to an alternative exemplary embodiment.

The above respective exemplary embodiments describe cases in which the electric signals that respectively flow through the signal line 3 (the D6 signal line 3) to which the radiation detection pixels 20B are connected and the signal line 3 (the D7 signal line 3) to which the radiation detection pixels 20B are not connected are converted into digital data, and, by subtracting the value of the converted digital data of the D7 signal line 3 from the value of the converted digital data of the D6 signal line 3, a value corresponding to the amount of noise is cancelled. However, the present invention is not limited thereto. For example, as shown in FIG. 28, the difference in the electric signals flowing respectively through the signal line 3 (the D6 signal line 3) to which the radiation detection pixels 20B are connected and the signal line 3 (the D7 signal line 3) to which the radiation detection pixels 20B are not connected may be determined by a differential amplifier, and the amount of noise may be cancelled as an analog signal. In this case, it suffices to convert the output signal from the differential amplifier, that expresses the difference between the electric signal flowing through the signal line 3 to which the radiation detection pixels 20B are connected and the electric signal flowing through the signal line 3 to which the radiation detection pixels 20B are not connected, into digital data, and compare the value of the converted digital data with a predetermined threshold value for radiation sensing, and start the irradiation of radiation.

Further, although the above exemplary embodiments describe cases in which the present invention is applied to the indirect-conversion-type radiation detecting element 10, the present invention may be applied to a direct-conversion-type radiation detecting element that directly converts radiation into charges at a semiconductor layer and accumulates the charges. In this case, direct-conversion-type sensor portions generate charges due to radiation being irradiated.

Moreover, although the above respective exemplary embodiments describe cases in which the present invention is applied to the radiographic imaging device 100 that detects images by detecting X-rays, the present invention is not limited to the same. The radiation that is the object of detection may be any of, for example, X-rays, visible light, ultraviolet rays, infrared rays, gamma rays, a particle beam, or the like.

The configuration of the radiographic imaging device 100 and the configurations of the radiation detecting element 10, that are described in the above respective exemplary embodiments, are examples, and appropriate changes may, of course, be made thereto within a scope that does not deviate from the gist of the present invention.

What is claimed is:

1. A radiographic imaging device comprising:
an insulating substrate at which are provided,
sensor portions for radiation detection that generate charges due to received radiation or light converted from radiation,
first lines that are connected to the sensor portions for radiation detection and through which flow electric signals that correspond to the charges generated at the sensor portions for radiation detection, and
second lines having a substantially same wiring pattern as the first lines; and
a detecting section that detects radiation on the basis of a difference between an electric signal flowing through the first line and an electric signal flowing through the second line, or a difference between values of digital data obtained by digitally converting an electric signal flowing through the first line and an electric signal flowing through the second line, respectively.

2. The radiographic imaging device of claim 1, wherein, at the insulating substrate, further provided with,
a plurality of scan lines that are provided in parallel,
a plurality of signal lines that are provided in parallel and that intersect the scan lines, and
a plurality of pixels that are provided at intersection portions of the scan lines and the signal lines and that have sensor portions that generate charges due to irradiated radiation, or illuminated light converted from irradiated radiation, and
wherein the sensor portions of some of the pixels function as the sensor portions for radiation detection.

3. The radiographic imaging device of claim 2, wherein, at pixels having the sensor portions for radiation detection, the sensor portions for radiation detection are electrically connected to the signal lines, and electric signals, that correspond to the charges generated at the sensor portions for radiation detection, flow to the signal lines, and
wherein at other pixels include, switching elements that turn ON and OFF in accordance with states of control signals that flow through the scan lines, and, at the other pixels, the sensor portions are electrically connected to the signal lines via the switching elements, and electric signals, that correspond to charges generated at the sensor portions, flow to the signal lines in accordance with the states of the control signals, and
any of the signal lines, to which the pixels having the sensor portions for radiation detection are connected, functions as the first line, and
any of the signal lines, to which the pixels having the sensor portions for radiation detection are not connected or at which a connected number of the pixels having the sensor portions for radiation detection is smaller than at the first line, functions as the second line.

4. The radiographic imaging device of claim 3, further comprising a plurality of signal detecting circuits to each of which a predetermined number of the plurality of signal lines are connected, and that detect electric signals that flow to the respective signal lines,
wherein any of the signal lines, that is connected to the same signal detecting circuit as the signal line that functions as the first line and to which the pixels having the sensor portions for radiation detection are not connected or at which a connected number of the pixels having the sensor portions for radiation detection is smaller than at the first line, functions as the second line.

5. The radiographic imaging device of claim 3, wherein a signal line, that is adjacent to the signal line that functions as the first line, and to which the pixels having the sensor portions for radiation detection are not connected or at which a connected number of the pixels having the sensor portions for radiation detection is smaller than at the first line, functions as the second line.

6. The radiographic imaging device claim 3, wherein two or more signal lines, to which the pixels having the sensor portions for radiation detection are not connected or at which a connected number of the pixels having the sensor portions for radiation detection is smaller than at the first line, function as the second lines, and
  wherein the detecting section respectively digitally converts electric signals flowing through the signal line that functions as the first line and the two or more signal lines that function as the second lines, and detects radiation on the basis of a difference between a value of digital data of the signal line that functions as the first line and an average value of digital data of the two or more signal lines that function as the second lines.

7. The radiographic imaging device claim 3, wherein the pixels having the sensor portions for radiation detection further includes short-circuited switching elements, and the sensor portions for radiation detection are electrically connected to the signal lines via the short-circuited switching elements.

8. The radiographic imaging device claim 3, wherein second scan lines are provided at the insulating substrate separately from the scan lines, and
  the pixels having the sensor portions for radiation detection include second switching elements that turn ON and OFF in accordance with states of control signals flowing through the second scan lines, and the sensor portions for radiation detection are electrically connected to the signal lines via the second switching elements.

9. The radiographic imaging device claim 2, wherein a plurality of the pixels including the sensor portions for radiation detection are respectively provided, at intervals of one or more pixels, in correspondence with some of the signal lines of the plurality of signal lines.

10. The radiographic imaging device claim 2, wherein the detecting section detects a start of irradiation of radiation, and the radiographic imaging device further comprises:
  a control signal outputting section that outputs the control signals to the plurality of scan lines; and
  a control section that, during standby, controls the control signal outputting section such that a resetting operation, in which control signals that carry out extracting of charges are outputted to the plurality of scan lines and charges are taken-out from the plurality of pixels, is carried out repeatedly, and, during radiographic imaging, when the start of irradiation of radiation is detected by the detecting section, the control section controls the control signal outputting section such that control signals that prohibit extracting of charges are outputted to the plurality of scan lines, and after irradiation of radiation ends, control signals that carry out extracting of charges are outputted to the plurality of scan lines.

11. The radiographic imaging device of claim 10, wherein, during the radiographic imaging, the control section controls the control signal outputting section such that the resetting operation is carried out repeatedly until the start of irradiation of radiation is detected by the detecting section.

12. The radiographic imaging device of claim 10, wherein, during the radiographic imaging, the control section controls the control signal outputting section such that control signals that prohibit extracting of charges are outputted to the plurality of scan lines until the start of irradiation of radiation is detected by the detecting section.

13. The radiographic imaging device claim 2, wherein, at a time of the resetting operation, the control signal outputting section outputs control signals that carry out extracting of charges, to the plurality of scan lines in order, or at a single time to all of the plurality of scan lines.

14. The radiographic imaging device of claim 1, wherein, at the insulating substrate, further provided with,
  a plurality of scan lines that are provided in parallel,
  a plurality of signal lines that are provided in parallel and intersect the scan lines, and
  a plurality of pixels that are provided at intersection portions of the scan lines and the signal lines, and that have sensor portions that generate charges due to irradiation of radiation, or illumination of light converted from irradiated radiation, and
  wherein the sensor portions for radiation detection, the first lines, and the second lines are disposed at a periphery of a region at which the plurality of pixels are provided.

* * * * *